(12) United States Patent
Jeon et al.

(10) Patent No.: US 11,825,706 B2
(45) Date of Patent: Nov. 21, 2023

(54) DISPLAY APPARATUS HAVING BRIDGE ELECTRODE ELECTRICALLY CONNECTING LOWER ELECTRODE PATTERN LAYER AND SEMICONDUCTOR LAYER OF TRANSISTOR

(71) Applicant: Samsung Display Co., Ltd., Yongin-si (KR)

(72) Inventors: Youngjae Jeon, Yongin-si (KR);
Hyunseong Kang, Yongin-si (KR);
Jongin Kim, Yongin-si (KR);
Seokhwan Bang, Yongin-si (KR);
Seungsok Son, Yongin-si (KR);
Junewhan Choi, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 148 days.

(21) Appl. No.: 17/123,850

(22) Filed: Dec. 16, 2020

(65) Prior Publication Data
US 2021/0359065 A1 Nov. 18, 2021

(30) Foreign Application Priority Data
May 12, 2020 (KR) .......................... 10-2020-0056660

(51) Int. Cl.
*H10K 59/126* (2023.01)
*H10K 59/123* (2023.01)
(Continued)

(52) U.S. Cl.
CPC ......... *H10K 59/126* (2023.02); *H10K 59/123* (2023.02); *H10K 59/131* (2023.02); *H10K 71/00* (2023.02); *H10K 59/1201* (2023.02)

(58) Field of Classification Search
CPC ............ H01L 27/3272; H01L 27/3248; H01L 27/3276; H01L 2227/323; H01L 51/56
(Continued)

(56) References Cited

U.S. PATENT DOCUMENTS

| 9,761,614 B2 | 9/2017 | Jeon et al. |
| 9,865,628 B2 | 1/2018 | Jeon et al. |

(Continued)

FOREIGN PATENT DOCUMENTS

| KR | 10-2016-0065647 | 6/2016 |
| KR | 10-2020-0000856 | 1/2020 |

*Primary Examiner* — Matthew E. Gordon
(74) *Attorney, Agent, or Firm* — KILE PARK REED & HOUTTEMAN PLLC

(57) ABSTRACT

A display apparatus includes a thin-film transistor located in a display area and including a semiconductor layer and a gate electrode; a storage capacitor located in the display area and including a first capacitor plate, a second capacitor plate, and a dummy capacitor plate overlapping each other; a light-emitting diode electrically connected to the thin-film transistor and the storage capacitor and including a pixel electrode, an interlayer, and a counter electrode; a pad located in a surrounding area adjacent to the display area; a lower electrode pattern layer disposed below the semiconductor layer, at least a portion of the lower electrode pattern layer overlapping the semiconductor layer; and a bridge electrode electrically connecting the semiconductor layer to the lower electrode pattern layer.

10 Claims, 26 Drawing Sheets

(51) Int. Cl.
    *H10K 59/131*     (2023.01)
    *H10K 71/00*     (2023.01)
    *H10K 59/12*     (2023.01)

(58) Field of Classification Search
    USPC .......................................................... 257/43
    See application file for complete search history.

(56) References Cited

U.S. PATENT DOCUMENTS

2018/0182836 A1*   6/2018   Beak ................... H01L 27/3276
2019/0006451 A1*   1/2019   Tanaka ................ H01L 29/7869

\* cited by examiner

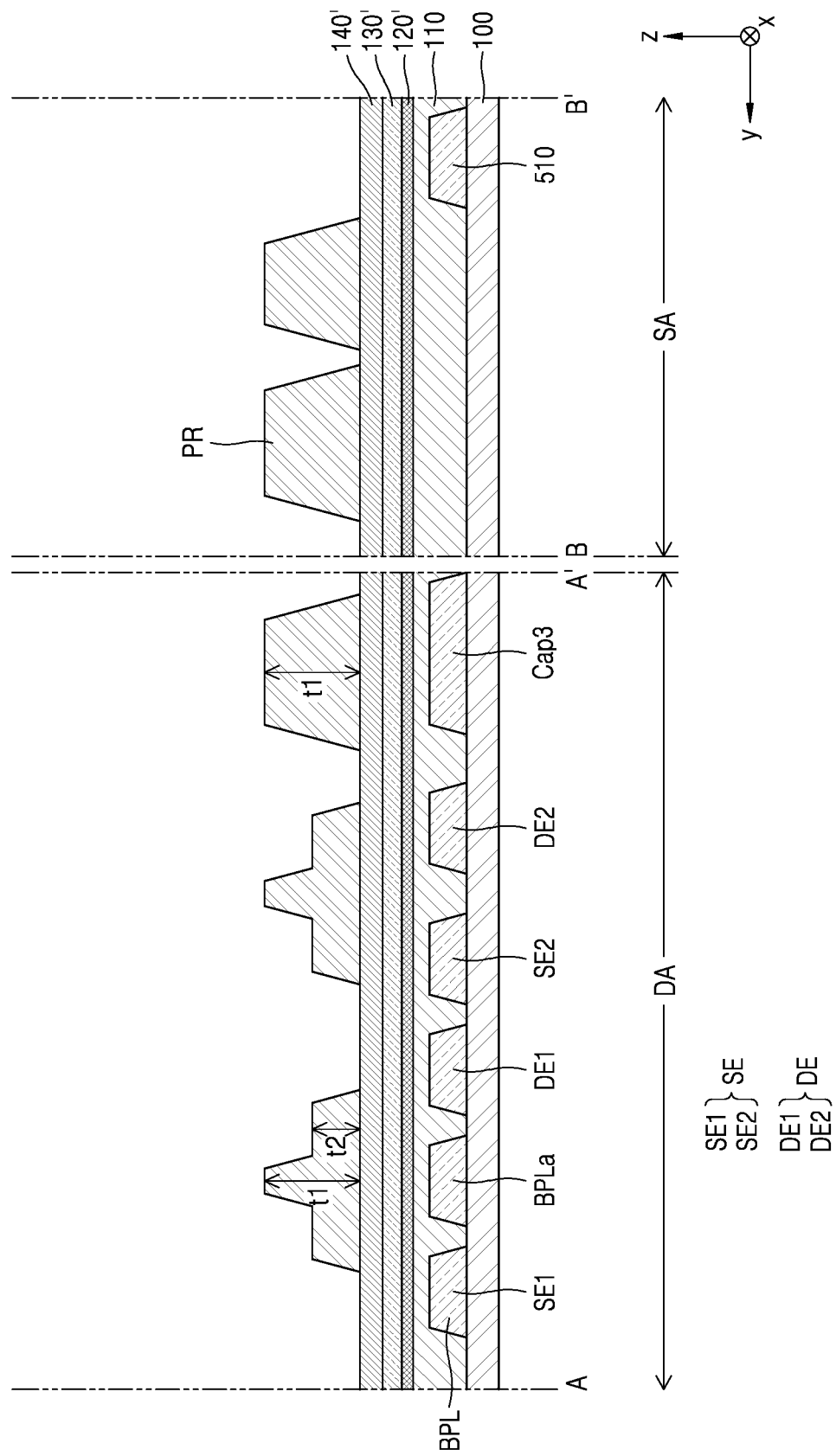

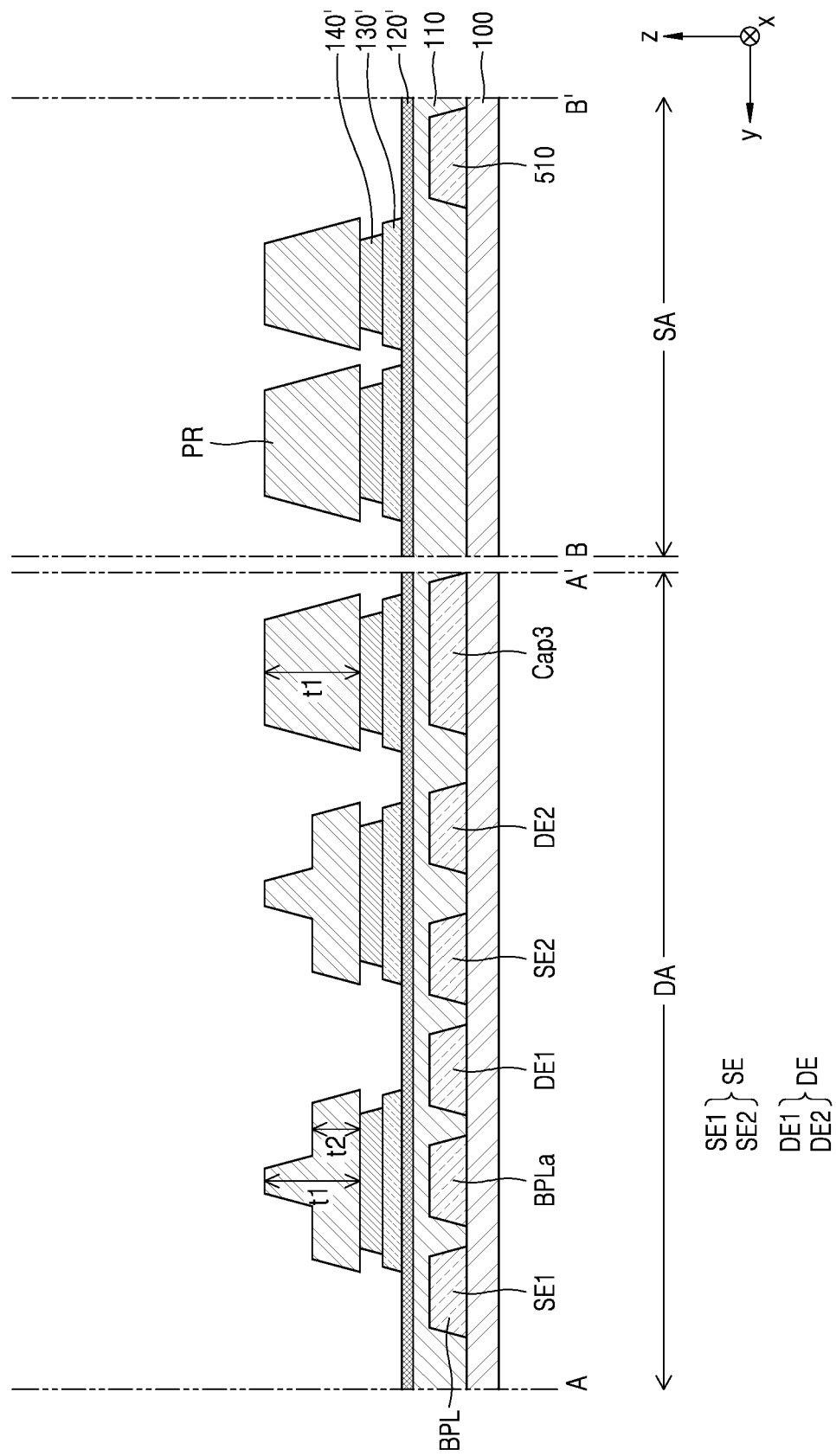

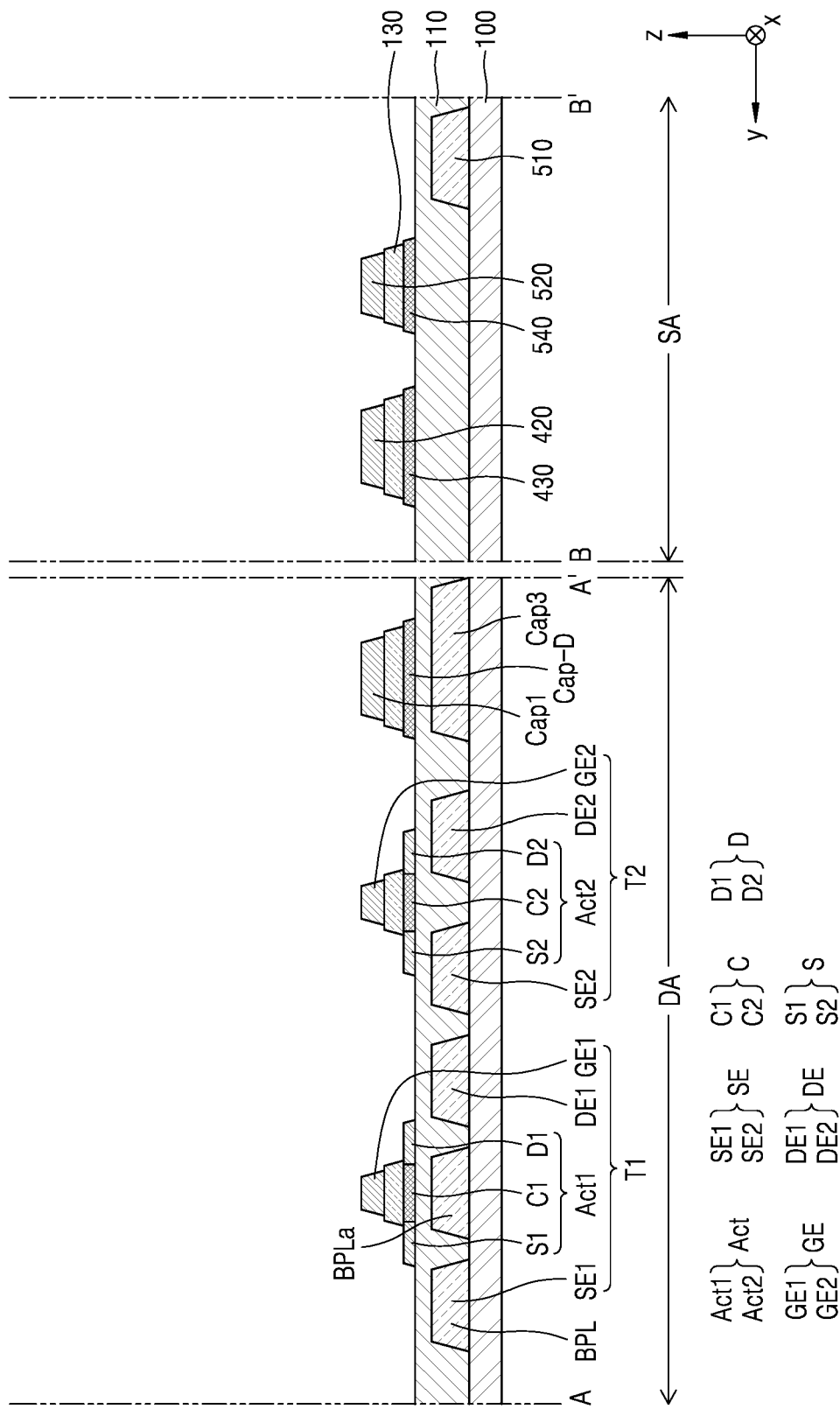

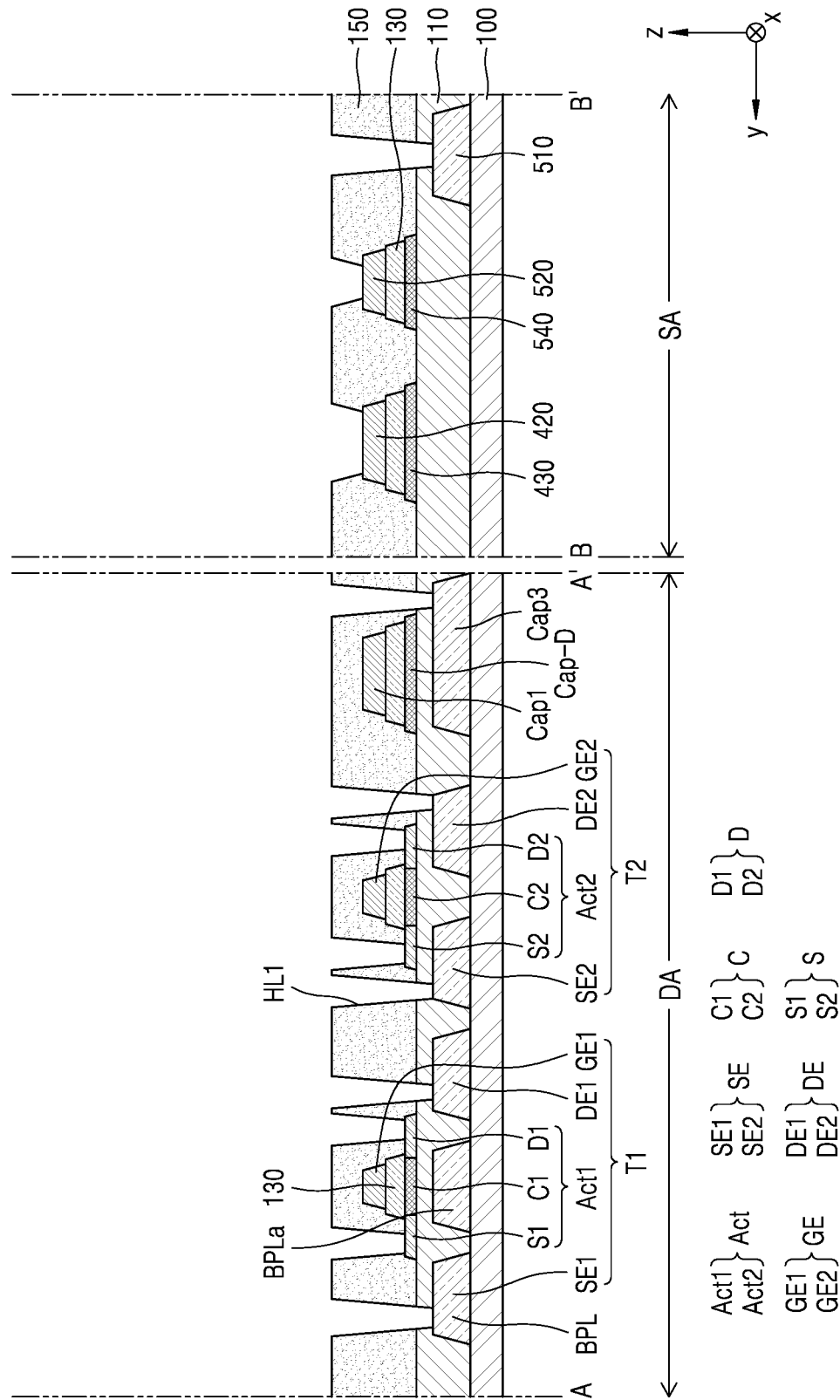

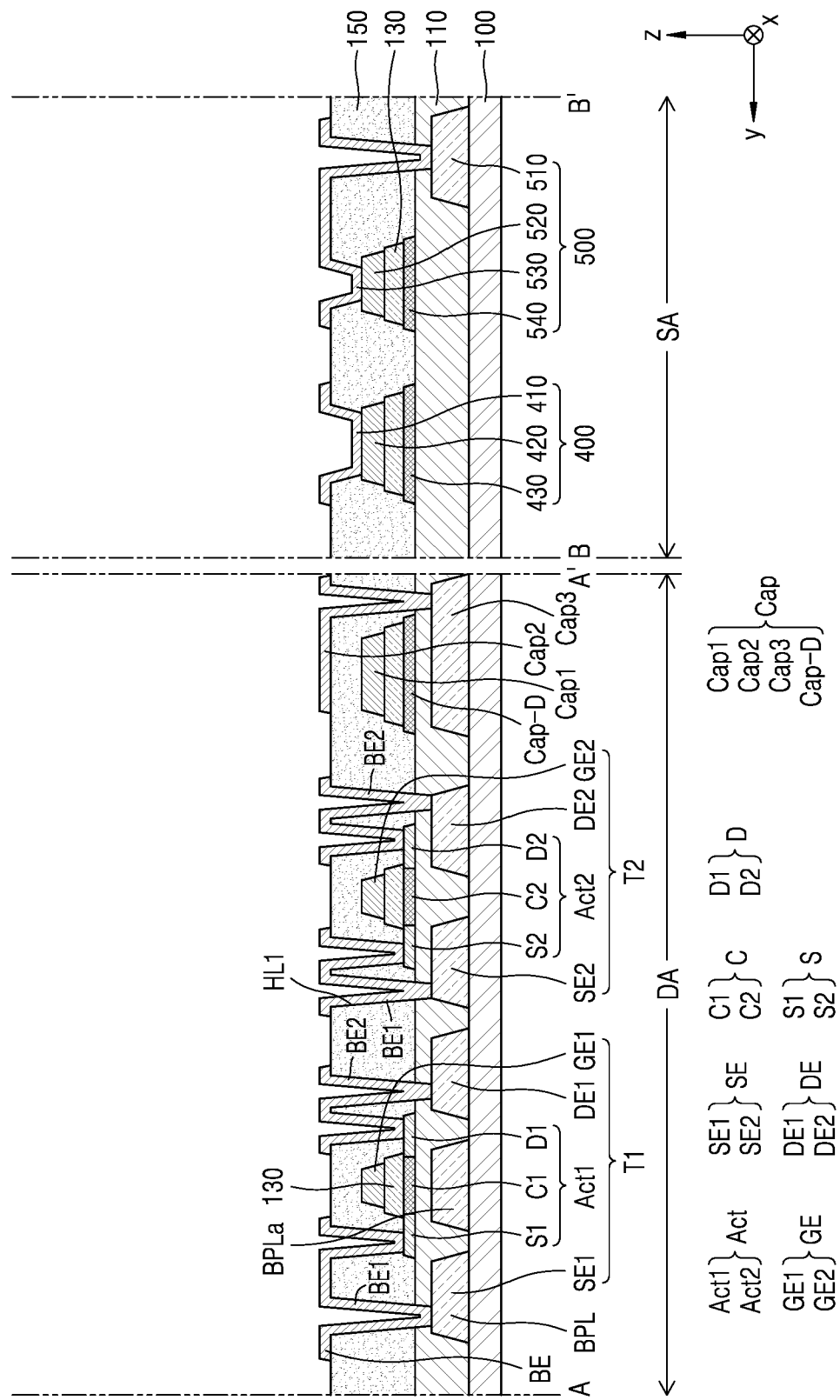

DISPLAY APPARATUS HAVING BRIDGE ELECTRODE ELECTRICALLY CONNECTING LOWER ELECTRODE PATTERN LAYER AND SEMICONDUCTOR LAYER OF TRANSISTOR

CROSS-REFERENCE TO RELATED APPLICATION(S)

This application claims priority to and benefits of Korean Patent Application No. 10-2020-0056660 under 35 U.S.C. § 119, filed on May 12, 2020, in the Korean Intellectual Property Office, the entire contents of which are incorporated herein by reference.

BACKGROUND

1. Technical Field

One or more embodiments relate to a display apparatus and a method of manufacturing the same.

2. Description of the Related Art

With the development of various electronic devices such as mobile phones, personal digital assistants (PDAs), computers, and large-size TVs, various types of display apparatuses applicable thereto have been developed. For example, as display apparatuses widely used in the market, there are liquid crystal display apparatuses including a backlight unit, and organic light-emitting display apparatuses that emit light of different colors for each color range. Recently, a display apparatus including a quantum dot color conversion layer (QD-CCL) has been developed.

Meanwhile, in general, an organic light-emitting display apparatus may include a pixel circuit including, for example, a thin-film transistor and organic light-emitting devices on a substrate, and the organic light-emitting devices emit light by themselves. In the process of forming the pixel circuit and organic light-emitting devices on a substrate, multiple photolithography processes may be used. A photolithography process may include a series of processes in which a pattern designed on a mask may be transferred onto a substrate, on which a thin film, such as a metal layer, an organic layer, or an inorganic layer, may be deposited, to form a target pattern on the thin film. The photolithography process may include a photoresist coating process, an exposure process, and a development process.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Patterned masks are very expensive, and as the number of masks used in the manufacturing process is increased, the manufacturing costs of the display apparatus may be increased. In addition, as the number of masks and the number of photolithography processes are increased, productivity may be decreased.

To solve a number of problems, including the problems as described above, the disclosure provides a display apparatus which may be manufactured using a reduced number of masks with higher productivity and lower power consumption while preventing a decrease in display performance, and a method of manufacturing the same. However, the above technical features are exemplary, and the scope of the disclosure is not limited thereto.

Additional aspects will be set forth in part in the description which follows and, in part, will be apparent from the description, or may be learned by practice of the presented embodiments of the disclosure.

According to an aspect of the disclosure, a display apparatus may include a thin-film transistor located in a display area and including a semiconductor layer and a gate electrode; a storage capacitor located in the display area and including a first capacitor plate, a second capacitor plate, and a dummy capacitor plate overlapping each other; a light-emitting diode electrically connected to the thin-film transistor and the storage capacitor and including a pixel electrode, an interlayer, and a counter electrode; a pad located in a surrounding area adjacent to the display area; a lower electrode pattern layer disposed below the semiconductor layer, at least a portion of the lower electrode pattern layer overlapping the semiconductor layer; and a bridge electrode electrically connecting the semiconductor layer to the lower electrode pattern layer.

According to an embodiment, the dummy capacitor plate and the semiconductor layer may include a same material.

According to an embodiment, the first capacitor plate and the gate electrode may include a same material.

According to an embodiment, the storage capacitor may include a third capacitor plate disposed below the first capacitor plate and the dummy capacitor plate and electrically connected to the second capacitor plate.

According to an embodiment, the pad may include a first pad electrode and a second pad electrode electrically connected to the first pad electrode, and the first pad electrode and the bridge electrode may include a same material.

According to an embodiment, the second pad electrode and the gate electrode or the lower electrode pattern layer may include a same material.

According to an embodiment, the semiconductor layer may include a channel region overlapping the gate electrode; and a source region and a drain region respectively disposed on opposite sides of the channel region, and the lower electrode pattern layer may include a source electrode electrically connected to the source region of the semiconductor layer; and a drain electrode electrically connected to the drain region of the semiconductor layer.

According to an embodiment, the display apparatus may further include a passivation layer overlapping the gate electrode, wherein the bridge electrode may be disposed on the passivation layer, and may include a first bridge electrode electrically connecting the source electrode of the lower electrode pattern to the source region of the semiconductor layer; and a second bridge electrode electrically connecting the drain electrode of the lower electrode pattern to the drain region of the semiconductor layer.

According to an embodiment, the display apparatus may further include a planarization insulating layer disposed on the bridge electrode, wherein the pixel electrode may be electrically connected to either the first bridge electrode or the second bridge electrode through a contact hole formed in the planarization insulating layer.

According to an embodiment, the first bridge electrode or the second bridge electrode may include the pixel electrode.

According to another aspect of the disclosure, a method of manufacturing a display apparatus may include forming a lower electrode pattern layer on a substrate; forming a buffer layer on the lower electrode pattern layer; forming a first material layer, a second material layer, and a third material layer on the buffer layer as a stacked structure; forming a photoresist pattern on the stacked structure using a single mask; forming a semiconductor layer, a gate insulating layer, and a gate electrode of a thin-film transistor using the photoresist pattern; and forming a first capacitor plate and a dummy capacitor plate of the storage capacitor using the photoresist pattern.

According to an embodiment, the method may further include exposing a portion of the stacked structure by the photoresist pattern, wherein the photoresist pattern may include a portion having a first thickness and a portion having a second thickness smaller than the first thickness.

According to an embodiment, the forming of the semiconductor layer, the gate insulating layer and the gate electrode of the thin-film transistor may include removing a portion of the third material layer; removing a portion of the second material layer; removing a portion of the photoresist pattern, the removed portion of the photoresist pattern having at least the second thickness; forming the gate electrode by etching the first material layer and the third material layer; forming the gate insulating layer and the semiconductor layer by etching the second material layer; and removing the photoresist pattern.

According to an embodiment, the semiconductor layer may include an oxide semiconductor material, and the semiconductor layer may include a channel region overlapping the gate electrode; and a source region and a drain region respectively disposed on opposite sides of the channel region.

According to an embodiment, the method may further include exposing portions of the first material layer by etching of the second material layer to form the source region and the drain region of the semiconductor layer.

According to an embodiment, the method may further include forming a passivation layer overlapping the semiconductor layer and the gate electrode; forming, in the passivation layer, first holes exposing at least a portion of the lower electrode pattern layer and semiconductor layer; and forming, on the passivation layer, an electrode pattern layer corresponding to the first holes.

According to an embodiment, the electrode pattern layer may electrically connect a portion of the semiconductor layer to a portion of the lower electrode pattern layer.

According to an embodiment, the dummy capacitor plate and the semiconductor layer may include a same material.

According to an embodiment, the first capacitor plate and the gate electrode may include a same material.

According to an embodiment, the forming of the electrode pattern layer may include forming at least a portion of the electrode pattern layer to overlap the first capacitor plate and the dummy capacitor plate; and electrically connecting the at least a portion of the electrode pattern layer to a portion of the lower electrode pattern layer.

According to an embodiment, the method may further include forming, on the electrode pattern layer, a planarization insulating layer including openings exposing a portion of the electrode pattern layer; forming a pixel electrode on the planarization insulating layer; and forming a pixel definition layer overlapping at least a portion of the pixel electrode.

According to an embodiment, the method may further include forming a passivation layer and a planarization insulating layer, each of the passivation layer and the planarization insulating layer overlapping the semiconductor layer and the gate electrode, and each of the passivation layer and the planarization insulating layer including second holes corresponding to at least a portion of the lower electrode pattern layer and semiconductor layer; and forming, on the passivation layer and the planarization insulating layer, an electrode pattern layer corresponding to the second holes.

According to an embodiment, the electrode pattern layer may include a pixel electrode.

According to an embodiment, the method may further include forming a first pad electrode and a dummy pad electrode of a pad using the photoresist pattern, wherein the forming of the electrode pattern layer may include forming a second pad electrode electrically connected to the first pad electrode.

According to an embodiment, the forming of the passivation layer and the planarization insulating layer may include forming the planarization insulating layer overlapping the semiconductor layer, the gate insulating layer, and the gate electrode layer, and including pattern holes corresponding to at least a portion of the lower electrode pattern layer and semiconductor layer; and forming the passivation layer including second holes corresponding to the pattern holes using the planarization insulating layer.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
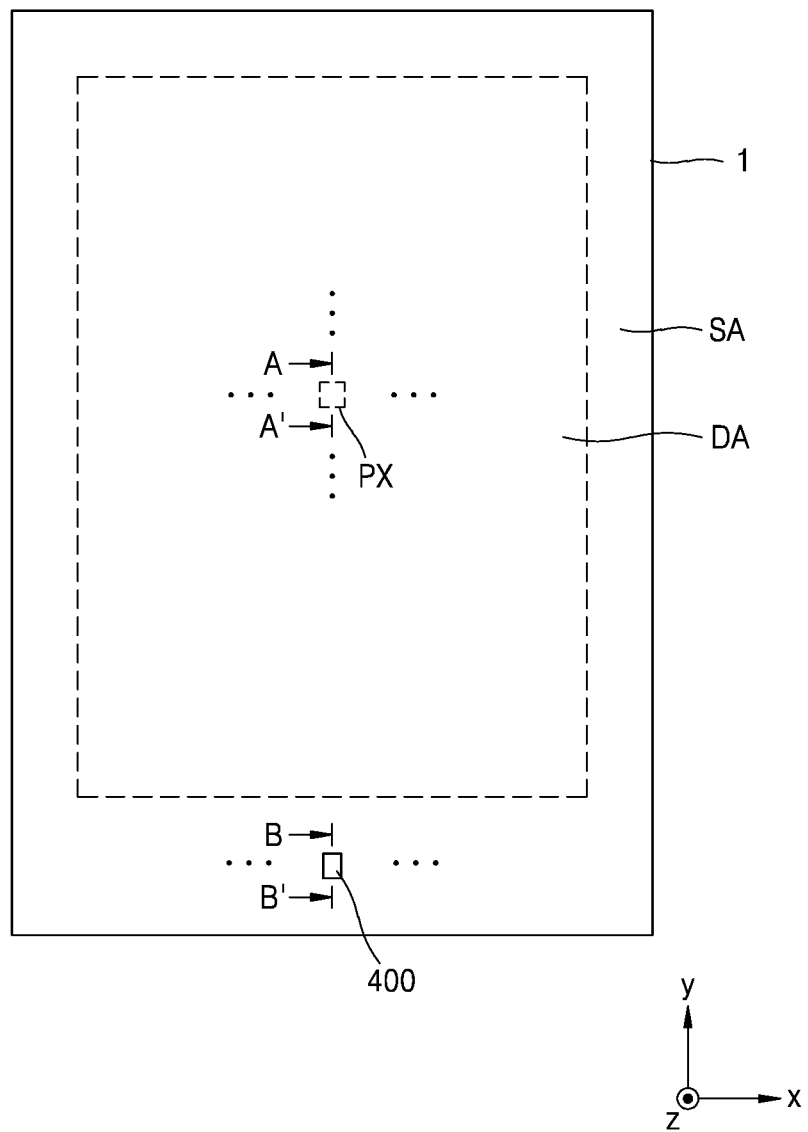
FIG. 1 is a plan view schematically illustrating a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

The disclosure may undergo various transformations and may have various embodiments, and embodiments will be illustrated in the drawings and described in detail in the detailed description. The effects and features of the disclosure and methods of achieving the same will become apparent with reference to the embodiments described below in detail in connection with the drawings. However, the disclosure is not limited to the embodiments disclosed below and may be implemented in various forms.

The example embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not be limited to the above terms. The above terms are used only to distinguish one component from another. For example, a first element referred to as a first element in one embodiment may be referred to as a second element in another embodiment without departing from the scope of the appended claims.

An expression used in the singular encompasses the expression of the plural, unless it has a clearly different meaning in the context.

In the specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, intervening layers, regions, or components may be present.

Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

In embodiments below, when a component is referred to as being "on a plane," it is understood that a component is viewed from the top, and when a component is referred to as being "on a schematic cross section," it is understood that the component is vertically cut and viewed from the side.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Sizes of components in the drawings may be exaggerated for convenience of explanation. In other words, since sizes and thicknesses of components in the drawings are arbitrarily illustrated for convenience of explanation, the following embodiments are not limited thereto.

When an embodiment may be implemented differently, a specific process order may be performed differently from the described order. For example, two consecutively described processes may be performed substantially at the same time or performed in an order opposite to the described order.

In the specification, the phrase "A and/or B" denotes A, B, or A and B. In addition, the phrase "at least one of A and B" denotes A, B, or A and B.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 shows a plan view schematically illustrating a display apparatus 1 according to an embodiment.

Referring to FIG. 1, the display apparatus 1 may include a display area DA and a surrounding area SA placed or disposed outside of or adjacent to the display area DA. The display apparatus 1 may provide an image through an array of pixels PX arranged or disposed two-dimensionally in the display area DA. Each of the pixels PX may include a light-emitting element that may emit light of a certain or predetermined color (for example, red light, green light, and blue light), and the display apparatus 1 may provide an image using light emitted through the light-emitting element.

In an embodiment, the display area DA may have a substantially rectangular shape with a long length in the ±y direction. In an embodiment, the display area DA may have a substantially rectangular shape with a long length in the ±x direction, a substantially polygonal shape such as a square, or an ellipse or a circle, by way of non-limiting example.

The surrounding area SA may be an area that may not provide an image, and may be a non-display area. The surrounding area SA may completely or incompletely surround the display area DA. Drivers, for example for providing electrical signals or electric power to the pixels PX may be located in the surrounding area SA. A pad 400, in which an electronic device, a printed circuit board, or the like may be electrically connected, may be placed in the surrounding area SA.

Figure 2:
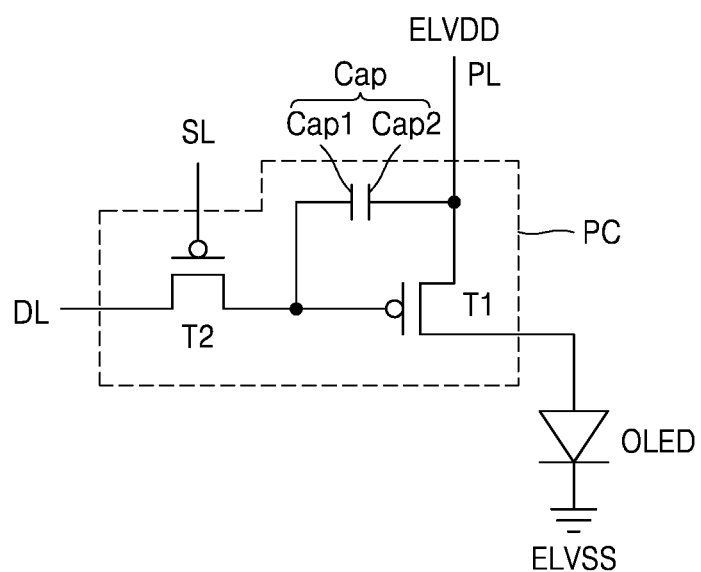
FIG. 2 is an equivalent circuit diagram of a pixel circuit connected to a light-emitting element of a display apparatus according to an embodiment.

FIG. 2 is an equivalent circuit diagram of a pixel circuit electrically connected to a light-emitting element of a display apparatus according to an embodiment.

Referring to FIG. 2, the display apparatus (see 1 of FIG. 1) may include a light-emitting element and a pixel circuit PC. A light-emitting element may include a light-emitting diode, such as an organic light-emitting diode OLED. The organic light-emitting diode OLED may be electrically connected to the pixel circuit PC, and may receive a driving voltage through the pixel circuit PC and emit light. The light-emitting element may emit light through the light-emitting region, and the light-emitting region may be defined as a pixel (see PX of FIG. 1).

The pixel circuit PC may include thin-film transistors and a storage capacitor. In an embodiment, the pixel circuit PC may include a first thin-film transistor T1, a second thin-film transistor T2, and a storage capacitor Cap.

The second thin-film transistor T2 may be a switching thin-film transistor, may be electrically connected to a scan line SL and a data line DL, and, based on the switching voltage (or switching signal) input through the scan line SL, and may transfer a data voltage (or data signal) input through the data line DL to the first thin-film transistor T1.

The storage capacitor Cap may be electrically connected to the second thin-film transistor T2 and a driving voltage line PL, and may store a voltage corresponding to the difference between the voltage received from the second thin-film transistor T2 and the first power voltage ELVDD supplied to the driving voltage line PL. The storage capacitor Cap may include at least a first capacitor plate Cap1 and a second capacitor plate Cap2.

The first thin-film transistor T1 may be a driving thin-film transistor, and may be electrically connected to a driving voltage line PL and a storage capacitor Cap, and may control the driving current flowing in an organic light-emitting diode OLED through the driving voltage line PL corresponding to the value of the voltage stored in the storage capacitor Cap. The organic light-emitting diode OLED may emit light having a certain luminance by driving current. The counter electrode (for example, a cathode) of the organic light-emitting diode OLED may receive a second power voltage (ELVSS).

The pixel circuit PC shown in FIG. 2 may include two thin-film transistors and one storage capacitor, but one or more embodiments are not limited thereto. For example, the pixel circuit PC may include three or more thin-film transistors and/or two or more storage capacitors. In an embodiment, the pixel circuit PC may include seven thin-film transistors and one storage capacitor. The number of the thin-film transistors and the number of the storage capacitors may vary depending on the design of the pixel circuit PC. However, for convenience of description below, a case where the pixel circuit PC may include two thin-film transistors and one storage capacitor will be described.

Figure 3:
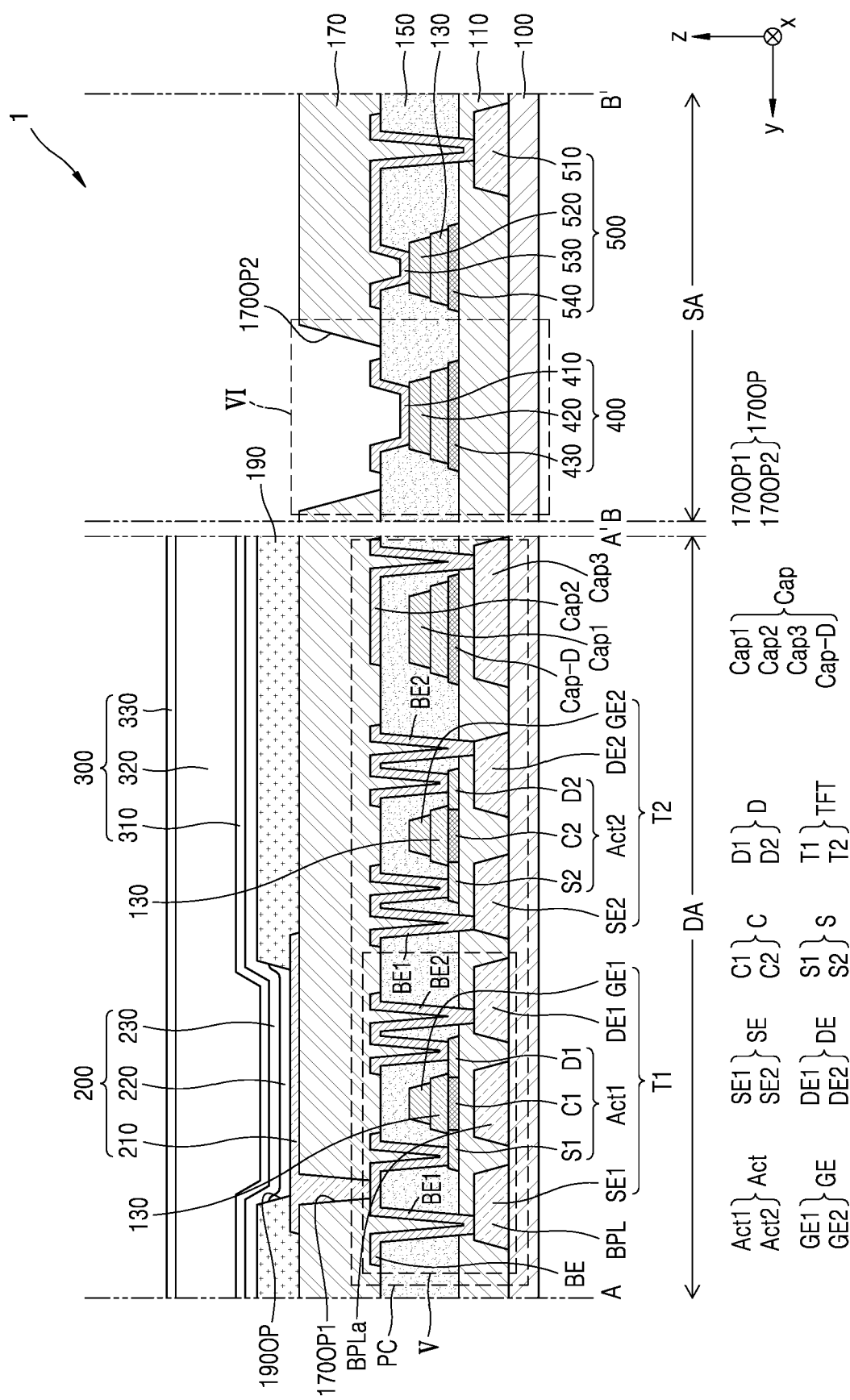
FIG. 3 is a schematic cross-sectional view schematically illustrating a portion of a display apparatus according to an embodiment.

FIG. 3 is a schematic cross-sectional view schematically illustrating a portion of a display apparatus according to an embodiment.

Referring to the display area DA of FIG. 3, a pixel circuit PC may be formed or disposed on the substrate 100, and a light-emitting element 200, such as an organic light-emitting diode OLED, may be formed or disposed on the pixel circuit PC.

The substrate 100 may include glass or polymer resin. For example, the polymer resin may include polyether sulfone, polyacrylate, polyether imide, polyethylene naphthalate, polyethylene terephthalate, polyphenylene sulfide, polyarylate, polyimide, polycarbonate, or cellulose acetate propionate. In an embodiment, the substrate 100 may have a single-layered structure including a glass material, and in an embodiment, the substrate 100 may have a multi-layer structure including a base layer including a polymer resin and an inorganic layer.

The buffer layer 110 may be placed on the substrate 100. The buffer layer 110 may reduce or block the penetration of foreign materials, moisture, or external air from the bottom of the substrate 100 and may provide a flat surface on the substrate 100. The buffer layer 110 may include an inorganic insulating material such as silicon oxide, silicon oxynitride, or silicon nitride and may have a single-layer or multilayer structure including the above material.

The pixel circuit PC placed or disposed on the substrate 100 may include the first thin-film transistor T1, the second thin-film transistor T2, and the storage capacitor Cap. The first thin-film transistor T1 and the second thin-film transistor T2 may have the same structure. For convenience of description below, unless there is a difference in configuration, the first thin-film transistor T1 and the second thin-film transistor T2 may be collectively referred to as a thin-film transistor TFT, and the first semiconductor layer Act1 and the second semiconductor layer Act2 may be collectively referred to as a semiconductor layer Act, the first gate electrode GE1 and the second gate electrode GE2 may be collectively referred to as a gate electrode GE, the first source electrode SE1 and the second source electrode SE2 may be collectively referred to as a source electrode SE, and the first drain electrode DE1 and the second drain electrode DE2 may be collectively referred to as a drain electrode DE.

The thin-film transistor TFT may include the semiconductor layer Act, the gate electrode GE overlapping the channel region C of the semiconductor layer Act, the source electrode SE, and the drain electrode DE. A gate insulating layer 130 may be positioned or disposed between the semiconductor layer Act and the gate electrode GE.

The semiconductor layer Act may include polysilicon. In an embodiment, the semiconductor layer Act may include amorphous silicon. In an embodiment, the semiconductor layer Act may include an oxide semiconductor material including at least one selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). In an embodiment, the oxide semiconductor material may be an In—Ga—Zn—O (IGZO) semiconductor material including metals such as indium (In) and gallium (Ga) in ZnO.

Meanwhile, because an oxide semiconductor may have a high carrier mobility and a low leakage current, a voltage drop thereof may not be great even in a case that a driving time thereof may be long. For example, low-frequency driving may be possible because a color change of an image due to a voltage drop may not be great even in the case of low-frequency driving. As described above, in the case of an oxide semiconductor, the leakage current may be small. Accordingly, in a case that a thin-film transistor TFT may be formed by using the oxide semiconductor, the leakage current that may flow to the gate electrode GE may be prevented and the power consumption may be reduced.

The semiconductor layer Act may include a channel region C, and a source region S and a drain region D, respectively, on the opposite sides of the channel region C. For example, the source region S and the drain region D may be doped with impurities, and the impurities may include N-type impurities or P-type impurities. The channel region C may collectively refer to a first channel region C1 and a second channel region, C2. Similarly, the source region S may collectively refer to a first source region S1 and a second source region, S2. Similarly, the drain region D may collectively refer to a first drain region D1 and a second drain region, D2.

A lower electrode pattern layer BPL may be placed or disposed under or below the semiconductor layer Act. The lower electrode pattern layer BPL may be placed or disposed between the substrate 100 and the buffer layer 110, and may be covered or overlapped by the buffer layer 110.

The lower electrode pattern layer BPL may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single-layer structure or a multi-layer structure.

The lower electrode pattern layer BPL may include the source electrode SE and the drain electrode DE of the thin-film transistor TFT. Therefore, the source electrode SE and the drain electrode DE may be positioned on the same layer and may be placed or disposed under or below the semiconductor layer Act. The source electrode SE and the drain electrode DE may include the same or similar material, and may include the same or similar material as the lower electrode pattern layer BPL. In an embodiment, the source electrode SE and the drain electrode DE may each include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may each have a single-layer structure or a multi-layer structure. For example, the source electrode SE and the drain electrode DE may have a three-layer structure of a titanium layer/aluminum layer/titanium layer.

At least a portion BPLa of the lower electrode pattern layer BPL and the semiconductor layer Act may overlap. In an embodiment, the portion BPLa of the lower electrode pattern layer BPL and a first semiconductor layer Act1 of the first thin-film transistor T1 may overlap. Accordingly, the entering of light into the first semiconductor layer Act1 may be prevented.

The portion BPLa of the lower electrode pattern layer BPL may be electrically connected to the first source electrode SE1 to receive a constant voltage, for example, a first power voltage (see ELVDD of FIG. 2), applied thereto, and to prevent the first thin-film transistor T1 from being affected by surrounding electrodes, thereby resulting in an electrical stability. Accordingly, the driving thin-film transistor, which may be the first thin-film transistor T1, may have a stabilized output characteristic, and the light-emitting element of the display apparatus 1 may emit light with a constant luminance. Thus, the display performance and the display quality may be improved.

The gate electrode GE may include a low-resistance conductive material such as molybdenum (Mo), aluminum (Al), copper (Cu), and/or titanium (Ti), and may have a single-layer or multi-layer structure formed by using the above-described materials.

The gate insulating layer 130 may be placed or disposed between the semiconductor layer Act and the gate electrode GE, and may include inorganic insulating materials such as silicon oxide, silicon oxynitride, and silicon nitride, and may have a single-layer or multi-layer structure, each including the materials as described above.

The passivation layer 150 may be placed or disposed on the gate electrode GE, and may cover or overlap the gate electrode GE and the semiconductor layer Act. The passivation layer 150 may include an inorganic insulating material such as silicon oxide, silicon nitride, and silicon oxynitride, and may have a single-layered or multi-layered structure including the stated materials.

In an embodiment, a bridge electrode BE may be placed or disposed on the passivation layer 150. The bridge electrode BE may electrically connect the semiconductor layer Act with the lower electrode pattern layer BPL. In an embodiment, the bridge electrode BE may include the first bridge electrode BE1 electrically connecting the source electrode SE with the source region S of the semiconductor layer Act and the second bridge electrode BE2 electrically connecting the drain electrode DE and the drain region D of the semiconductor layer Act. For example, the first bridge electrode BE1 may be electrically connected to the source region S through a contact hole formed in the passivation layer 150, and may be electrically connected to the source electrode SE through a contact hole formed in the passivation layer 150 and the buffer layer 110. Similarly, the second bridge electrode BE2 may be electrically connected to the drain region D through a contact hole formed in the passivation layer 150, and the drain electrode DE through a contact hole formed in the passivation layer 150 and the buffer layer 110.

The bridge electrode BE may include a conductive material including aluminum (Al), copper (Cu), titanium (Ti), or the like and may be formed as a single layer or multiple layers including the above materials.

The storage capacitor Cap may include the first capacitor plate Cap1, the second capacitor plate Cap2, the third capacitor plate Cap3, and the dummy capacitor plate Cap-D overlapping each other. The passivation layer 150 may be placed or disposed between the first capacitor plate Cap1 and the second capacitor plate Cap2, the gate insulating layer 130 may be placed or disposed between the first capacitor plate Cap1 and the dummy capacitor plate Cap-D, and the buffer layer 110 may be placed or disposed between the dummy capacitor plate Cap-D and the third capacitor plate Cap3.

The first capacitor plate Cap1 may include the same or similar material as the first gate electrode GE1. FIG. 3 shows that the first capacitor plate Cap1 and the first gate electrode GE1 may be spaced apart from each other, but, in an embodiment, the first capacitor plate Cap1 may include the first gate electrode GE1. For example, the first capacitor plate Cap1 may include the first gate electrode GE1, or a portion of the first gate electrode GE1 may include the first capacitor plate Cap1.

The second capacitor plate Cap2 may include the same or similar material as the bridge electrode BE, and may be electrically connected to the third capacitor plate Cap3 through contact holes formed in the passivation layer 150 and buffer layer 110. In this case, the passivation layer 150 disposed between the first capacitor plate Cap1 and the second capacitor plate Cap2 may function as a dielectric of the storage capacitor Cap.

The dummy capacitor plate Cap-D and the semiconductor layer Act may include the same or similar material, and may be formed or disposed on the same layer. For example, the dummy capacitor plate Cap-D may include the same or similar material as the channel region C of the semiconductor layer Act.

The third capacitor plate Cap3 may be placed or disposed under or below the first capacitor plate Cap1 and the dummy capacitor plate Cap-D, and may include the same or similar material as the lower electrode pattern layer BPL. For example, the third capacitor plate Cap3 may include the lower electrode pattern layer BPL, or a portion of the lower electrode pattern layer BPL may include the third capacitor plate Cap3. For example, the third capacitor plate Cap3 and the lower electrode pattern layer BPL may be formed as one body. In an embodiment, the second capacitor plate Cap2 may be omitted, in which case the third capacitor plate Cap3 may function as the second capacitor plate Cap2, and the gate insulating layer 130 disposed between the first capacitor plate Cap1 and the third capacitor plate Cap3 may function as a dielectric of the storage capacitor Cap.

A planarization insulating layer 170 may be placed or disposed on the passivation layer 150. The planarization insulating layer 170 may include openings 170OP exposing a portion of the bridge electrode BE. For example, the planarization insulating layer 170 may have a first opening 170OP1 exposing a portion of the first bridge electrode BE1 or the second bridge electrode BE2 and a second opening 170OP2 exposing a portion of the pad 400.

The planarization insulating layer 170 may include an organic insulating material such as acryl, benzocyclobutene (BCB), polyimide, or hexamethyldisiloxane (HMIDSO). In an embodiment, the planarization insulating layer 170 may include an inorganic material. The planarization insulating layer 170 may cover or overlap the thin-film transistors TFTs and may provide a flat top surface. The planarization insulating layer 170 may be provided as a single layer or multiple layers.

The pixel electrode 210 may be formed or disposed on the planarization insulating layer 170. The pixel electrode 210 may be electrically connected to a thin-film transistor TFT through a contact hole formed in the planarization insulating layer 170, for example, the first opening 170OP1.

The pixel electrode 210 may include a reflective layer including argentum (Ag), magnesium (Mg), aluminum (Al), platinum (Pt), palladium (Pd), aurum (Au), nickel (Ni), neodymium (Nd), iridium (Ir), chromium (Cr), or a compound thereof. The pixel electrode 210 may include a reflective layer including the above-stated materials, and a transparent conductive layer disposed on and/or under or below the reflective layer. The transparent conductive layer may include indium tin oxide (ITO), indium zinc oxide (IZO), zinc oxide (ZnO), indium oxide ($In_2O_3$), indium gallium oxide, or aluminum zinc oxide (AZO). In an embodiment, the pixel electrode 210 may have a triple-layered structure including ITO layer/Ag layer/ITO layer that may be sequentially stacked.

A pixel definition layer 190 may be placed or disposed on the pixel electrode 210. The pixel definition layer 190 may cover or overlap an edge of the pixel electrode 210 and may have an opening 190OP overlapping a center portion of the pixel electrode 210.

The pixel definition layer 190 may increase the distance between the edge of the pixel electrode 210 and an opposite electrode 230 disposed above the pixel electrode 210 to prevent the occurrence of an arc at the edge of the pixel electrode 210. The pixel definition layer 190 may include an organic insulating material such as polyimide, polyamide, acrylic resin, benzocyclobutene, hexamethyldisiloxane (HMDSO), or phenol resin by spin coating or the like within the spirit and the scope of the disclosure.

An interlayer 220 formed or disposed to correspond to the pixel electrode 210 may be placed or disposed on the pixel definition layer 190. The interlayer 220 may include a polymer or low-molecular weight organic material emitting light of a certain or predetermined color.

An opposite electrode 230 may be placed or disposed on the interlayer 220. An opposite electrode 230 may include a conductive material having a relatively low work function. For example, the opposite electrode 230 may include a (semi-)transparent layer including argentum (Ag), magnesium (Mg), aluminum (Al), nickel (Ni), chromium (Cr), lithium (Li), calcium (Ca), or an alloy thereof. Alternatively, the opposite electrode 230 may include a layer including ITO, IZO, ZnO, or $In_2O_3$ on the (semi-)transparent layer including the above materials. In an embodiment, the opposite electrode 230 may include argentum (Ag) and magnesium (Mg). The opposite electrode 230 may be integrally formed to entirely cover or overlap the display area DA.

The stacked structure of pixel electrode 210, interlayer 220, and opposite electrode 230 may form a light-emitting diode, such as an organic light-emitting diode OLED. The organic light-emitting diode OLED may emit red light, green light, or blue light, and an emission area in each organic light-emitting diode OLED may correspond to the pixel PX.

A thin-film encapsulation layer 300 may be disposed on the opposite electrode 230. The organic light-emitting diode OLED may be covered or overlapped by the thin-film encapsulation layer 300. The thin-film encapsulation layer 300 may include a first inorganic encapsulation layer 310 and a second and inorganic encapsulation layer 330, and an organic encapsulation layer 320 disposed between the first inorganic encapsulation layer 310 and the second and inorganic encapsulation layer 330.

The first and second inorganic encapsulation layers 310 and 330 may each include one or more inorganic insulating materials. The inorganic insulating material may include aluminum oxide, titanium oxide, tantalum oxide, hafnium oxide, zinc oxide, silicon oxide, silicon nitride, and/or silicon oxynitride. The first inorganic encapsulation layer 310 and the second and inorganic encapsulation layer 330 may be obtained by a chemical vapor deposition method.

The organic encapsulation layer 320 may include a polymer-based material. The polymer-based material may include an acryl-based resin, an epoxy-based resin, polyimide, polyethylene, for example. For example, the organic encapsulation layer 320 may include an acryl-based resin, such as polymethylmethacrylate, polyacrylic acid, and other materials within the spirit and the scope of the disclosure. The organic encapsulation layer 320 may be obtained by curing a monomer or applying polymer.

Referring to the surrounding area SA of FIG. 3, a scan driver (not shown), a data driver (not shown), by way of example, may be placed or disposed on the substrate 100, and the pad 400 and the electrode connection part 500 may be formed.

The pad 400 may be placed adjacent to any one of the edges of the substrate 100. The pad 400 may not be covered or overlapped but exposed by the planarization insulating layer 170. For example, a portion of the pad 400 may be exposed by the second opening 170OP2 of the planarization insulating layer 170, and may be electrically connected to a flexible printed circuit board through the second opening 170OP2. The flexible printed circuit board may electrically connect a controller with the pad 400, and may supply a signal or power transmitted from the controller. In an embodiment, a data driver may be placed or disposed on the flexible printed circuit board. In order to transmit a signal or voltage from the flexible printed circuit board to the pixels, the pad 400 may be electrically connected to wires.

In an embodiment, instead of the flexible printed circuit board, an integrated circuit may be placed on the pad 400. The integrated circuit may include, for example, a data driver, and may be electrically connected to the pad 400 through an anisotropic conductive film including a conductive ball.

The pad 400 may include a first pad electrode 410 including the same or similar material as the bridge electrode BE and a second pad electrode 420 electrically connected to the first pad electrode 410. In an embodiment, the second pad electrode 420 and the gate electrode GE may be placed on the same layer and may include the same or similar material. In this case, the pad 400 may include a dummy pad electrode 430. The dummy pad electrode 430 may be placed or disposed under or below the second pad electrode 420, and a gate insulating layer 130 may be placed or disposed between the dummy pad electrode 430 and the second pad electrode 420. The dummy pad electrode 430 and the semiconductor layer Act may be placed or disposed on the same layer and may include the same or similar material.

The electrode connection part 500 may include a first conductive layer 510 including the same or similar material as the lower electrode pattern layer BPL, a second conductive layer 520 including the same or similar material as the gate electrode GE, and a connection electrode 530 electrically connecting the first conductive layer 510 with the second conductive layer 520. The connection electrode 530 may include the same or similar material as the bridge electrode BE, and may bridge-connect the first conductive layer 510 with the second conductive layer 520 through contact holes formed in the passivation layer 150 and the buffer layer 110.

The first conductive layer 510, and the source electrode SE and drain electrode DE of the thin-film transistor TFT may be placed or disposed on the same layer, and may be electrically connected to each other. The second conductive layer 520 may be placed or disposed on the same layer as, and may be electrically connected to, the gate electrode GE of the thin-film transistor TFT, or the second pad electrode 420 of the pad 400. Therefore, the electrode connection part 500 may electrically connect the gate electrode GE to the source electrode SE or drain electrode DE, or the second pad electrode 420 to the source electrode SE or drain electrode DE. The electrode connection part 500 may be covered or overlapped by the planarization insulating layer 170.

Although FIG. 3 shows that the electrode connection part 500 may be placed or disposed in the surrounding area SA, embodiments are not limited to the configuration. In an embodiment, the electrode connection part 500 may be placed or disposed in the display area DA.

Figure 4A:
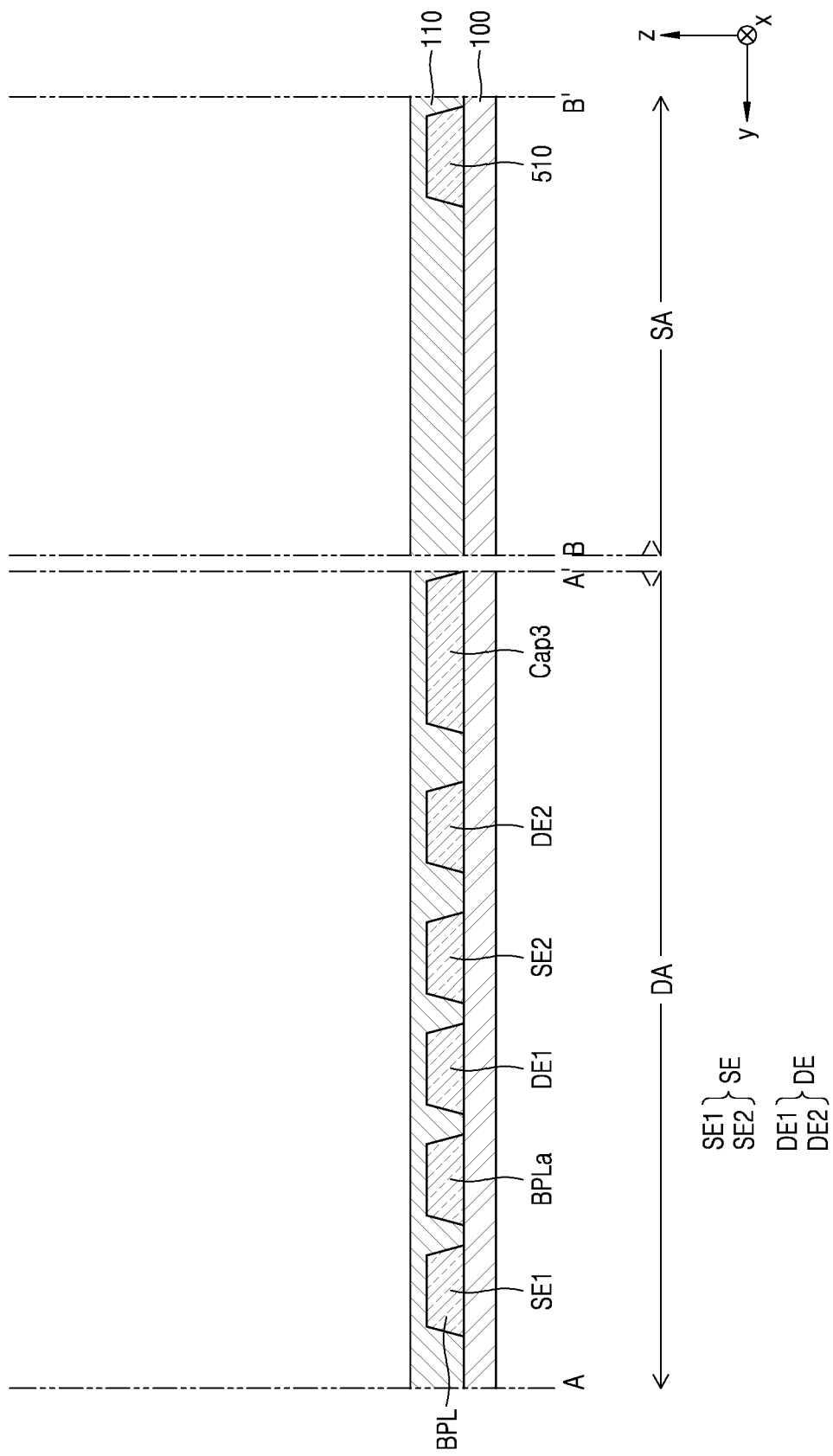
FIGS. 4A to 4O are schematic cross-sectional views schematically illustrating processes of a method of manufacturing the display apparatus of FIG. 3.
Figure 4B:
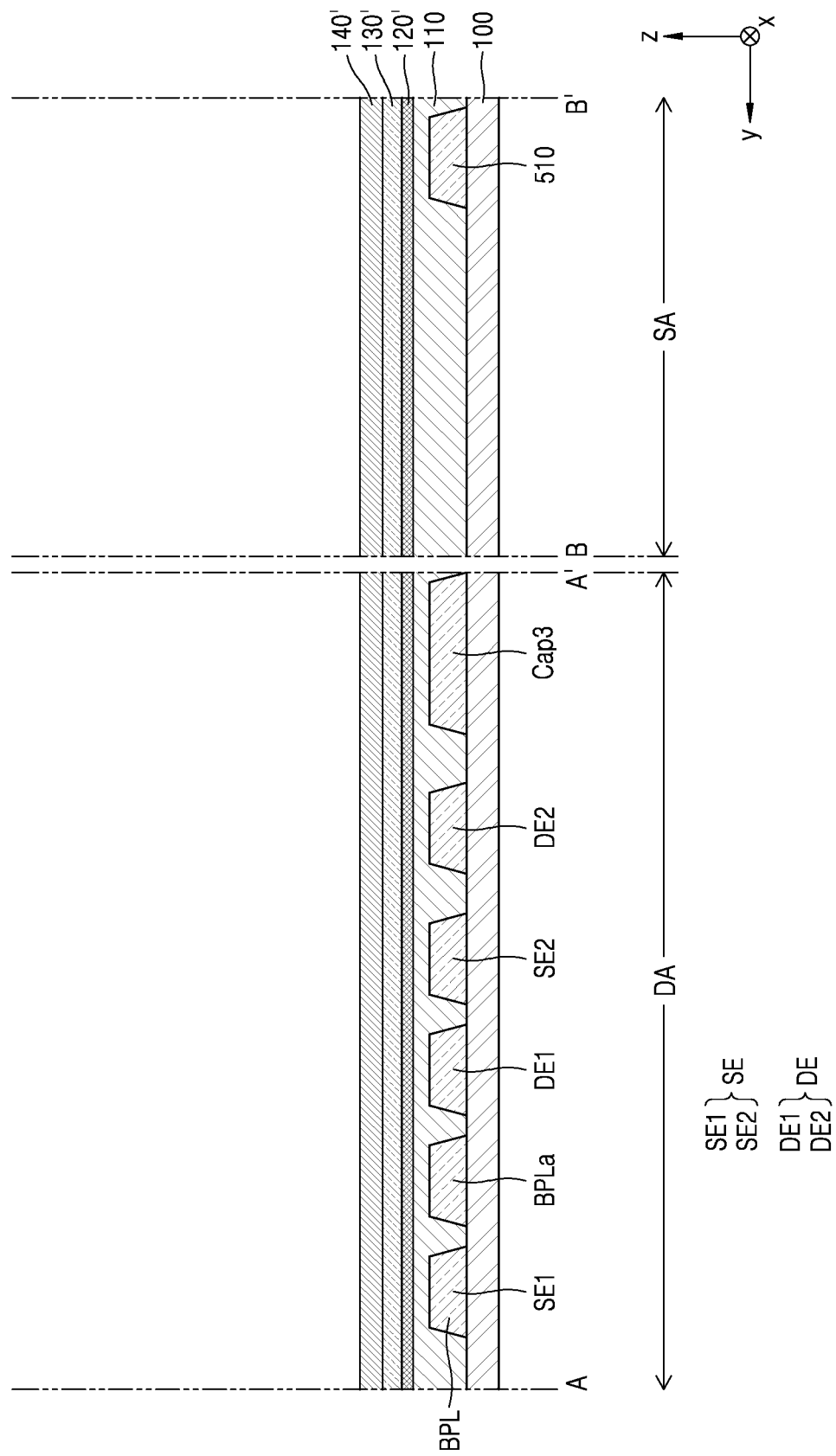
Figure 4D:
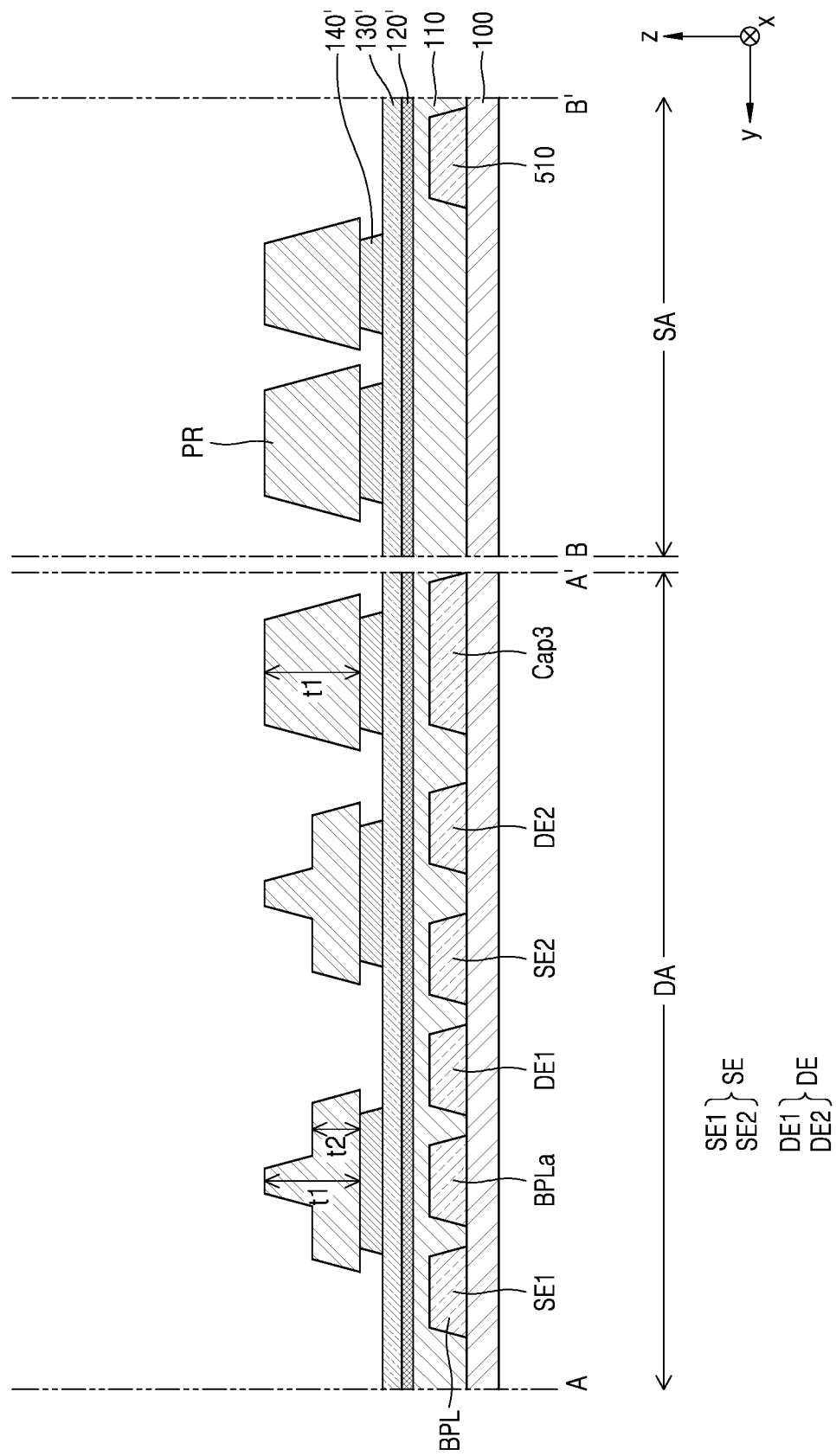
Figure 4F:
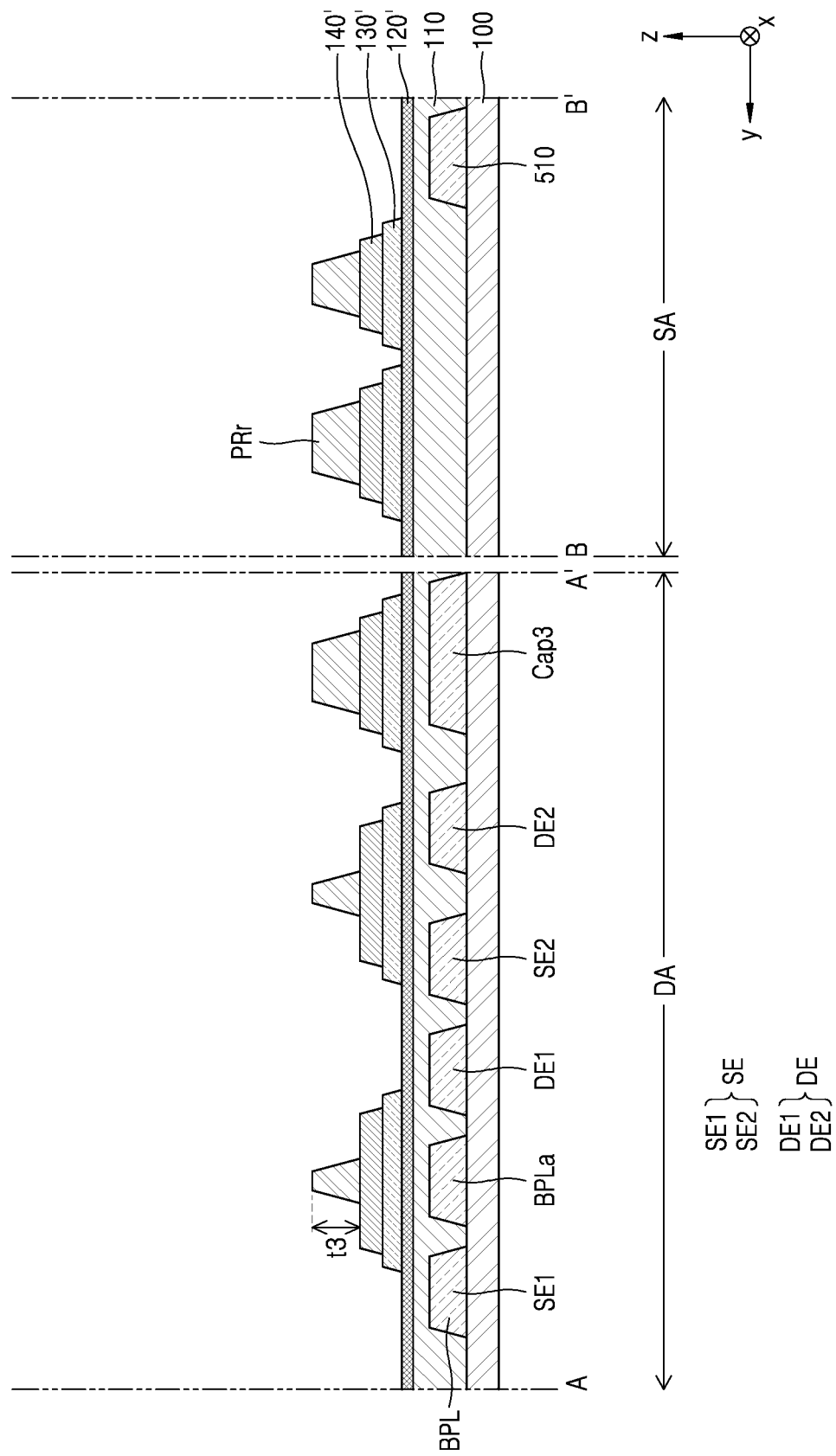
Figure 4G:
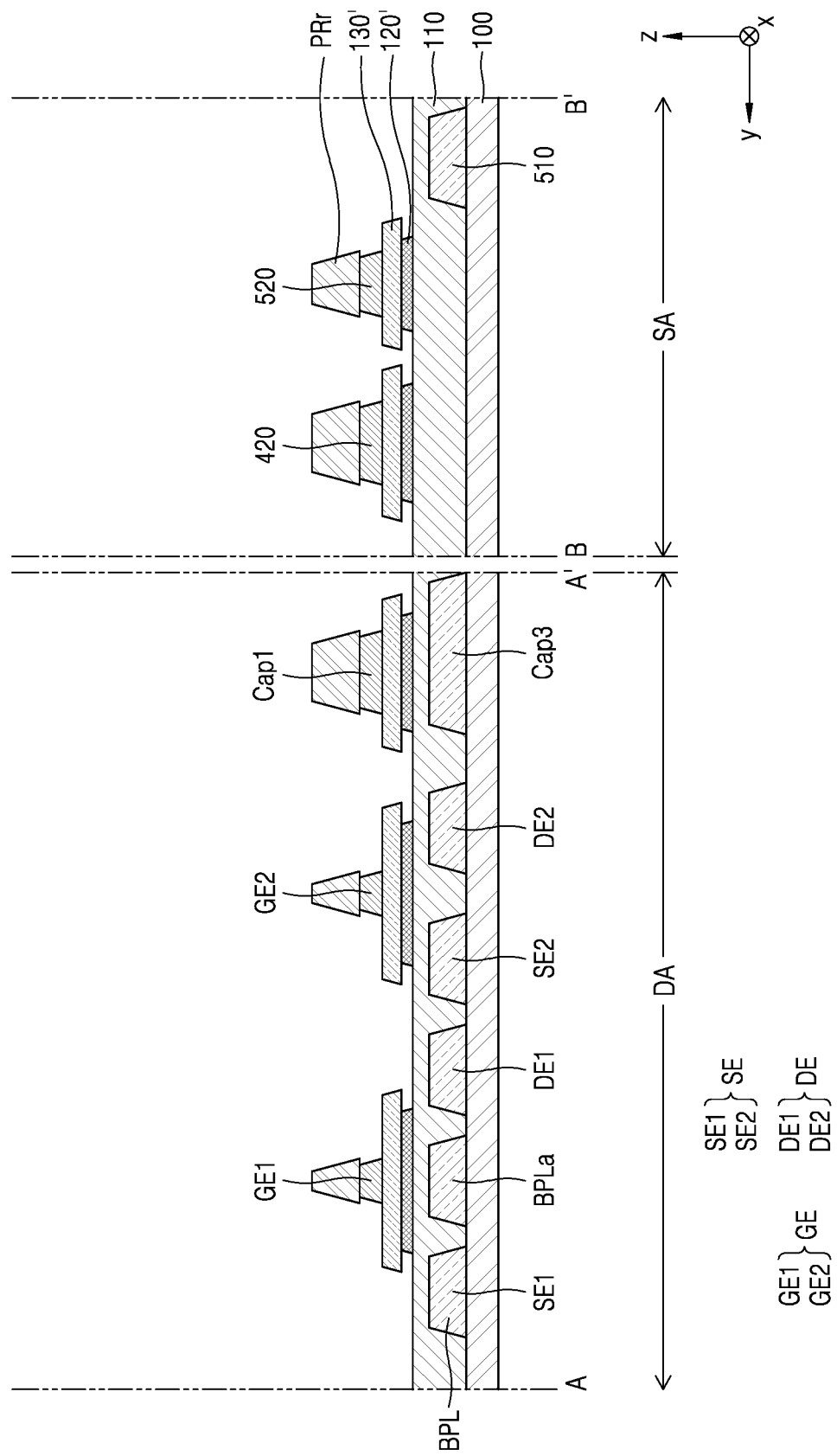
Figure 4H:
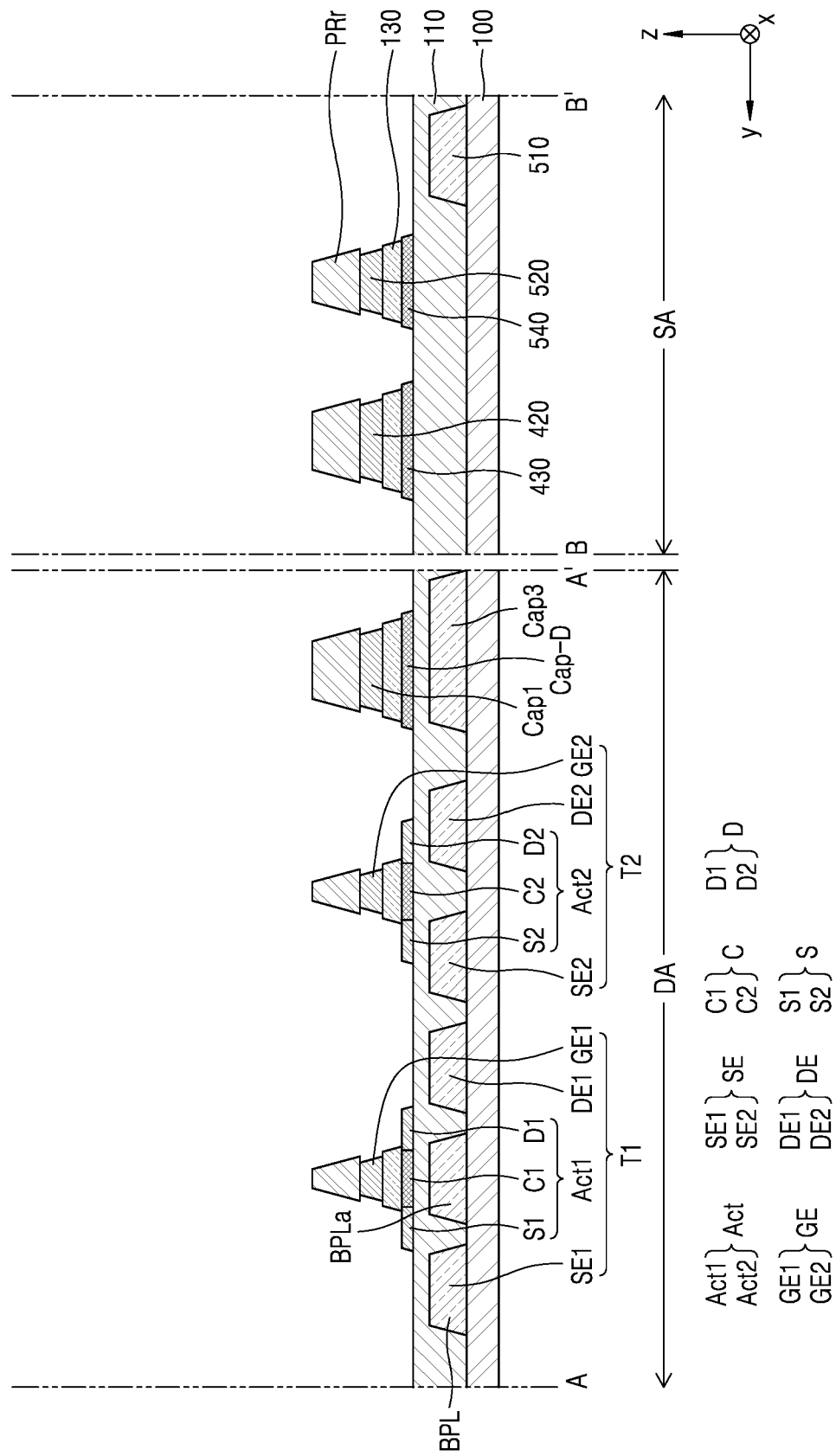
Figure 4J:
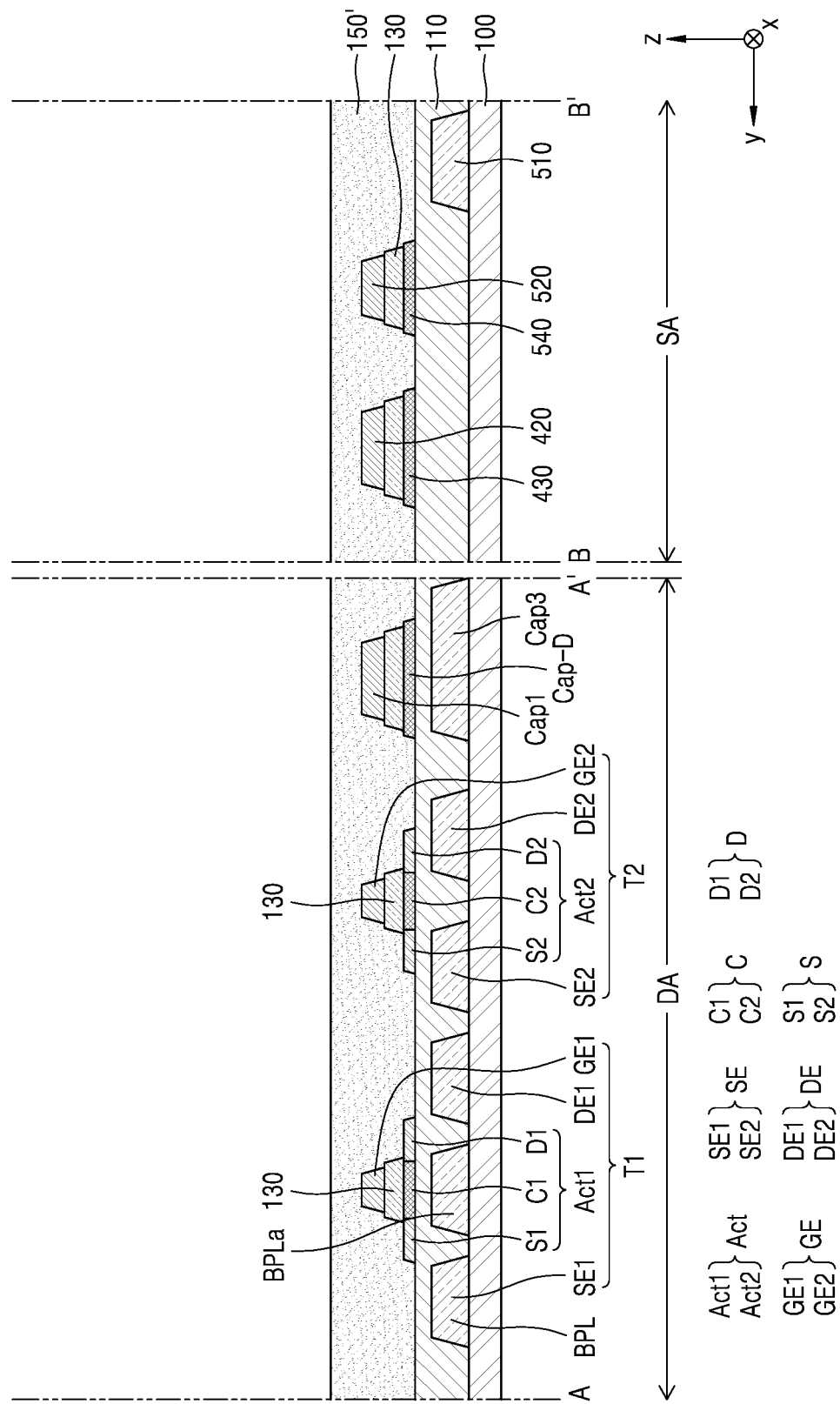
Figure 4M:
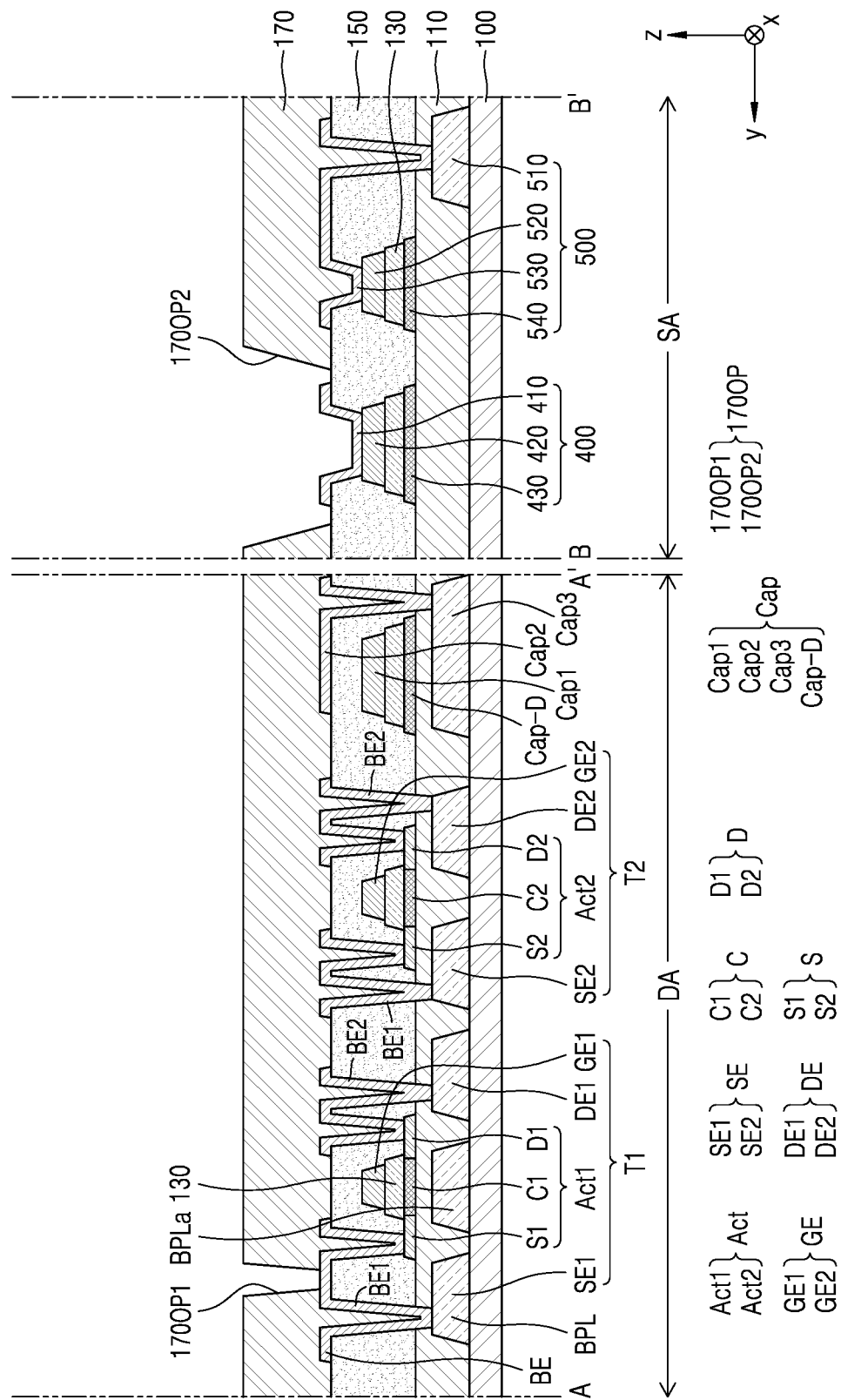
Figure 4N:
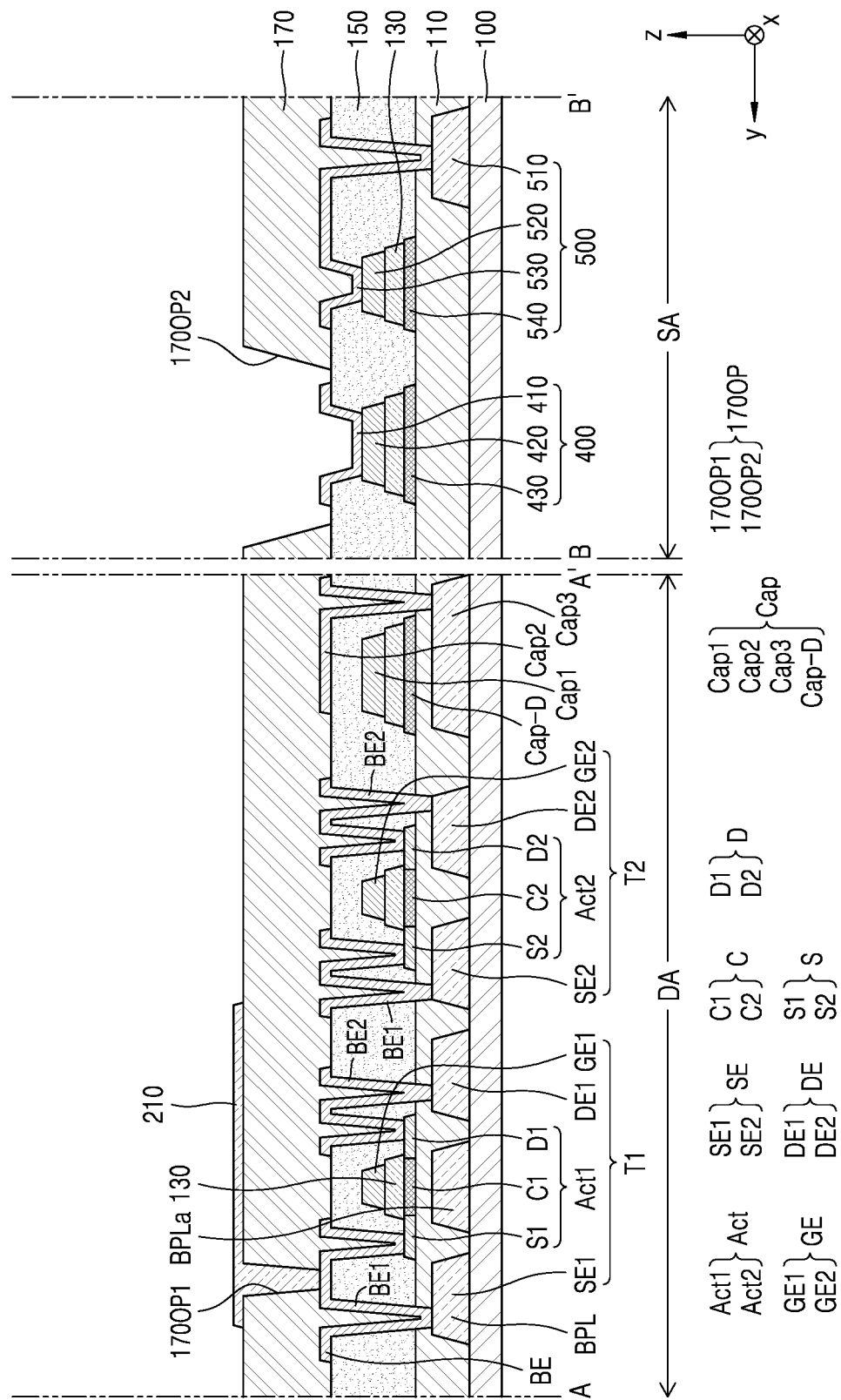
Figure 4O:
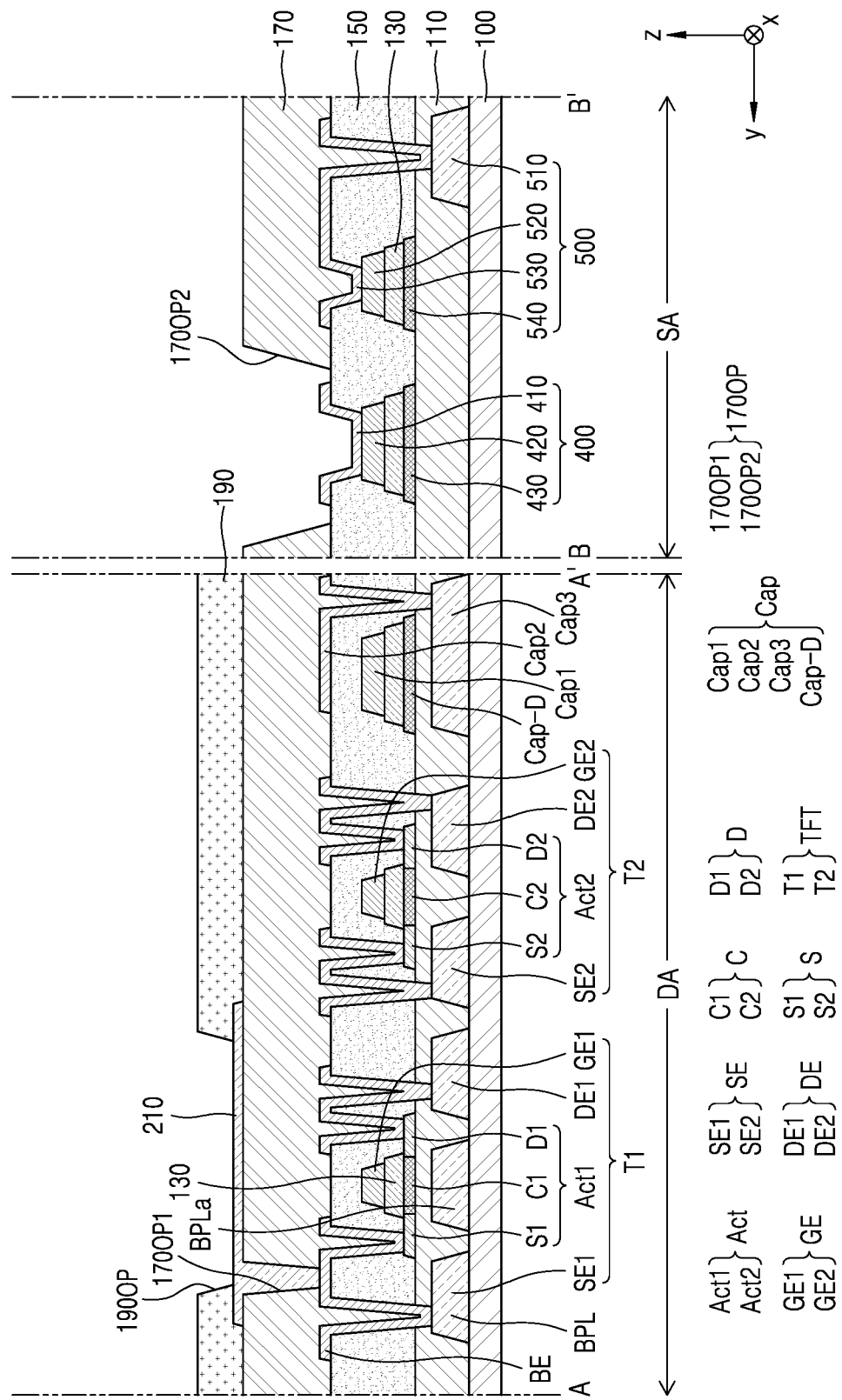

FIGS. 4A to 4O are schematic cross-sectional views of the display apparatus of FIG. 3 schematically illustrating processes of the manufacturing method thereof. The components that are substantially the same as in FIG. 3 are indicated by the same reference numerals, and detailed description thereof will be omitted.

Referring to FIG. 4A, the lower electrode pattern layer BPL may be formed or disposed on the substrate 100. The lower electrode pattern layer BPL may be formed by a photolithography process. A preliminary lower electrode pattern layer (not shown) may be formed or disposed on the substrate 100, and a first photoresist (not shown) may be coated thereon. Then, the first photoresist may be exposed and developed through a first mask having a pattern corresponding to the lower electrode pattern layer BPL, thereby forming a first photoresist pattern (not shown). In this regard, the photoresist may be positive or negative. The preliminary lower electrode pattern layer may be etched by using the first photoresist pattern as an etch mask and then, the first photoresist pattern may be removed therefrom, thereby forming the lower electrode pattern layer BPL. The lower electrode pattern layer BPL may include, as described above, the source electrode SE, the drain electrode DE, the portion of the lower electrode pattern layer BPLa overlapping the channel region C of the semiconductor layer Act, the first conductive layer 510 of the electrode connection part 500, and the third capacitor plate Cap3 of the storage capacitor Cap.

After the lower electrode pattern layer BPL is formed, the buffer layer 110 may be formed thereon as a whole. The buffer layer 110 may be formed by, for example, vapor deposition methods such as chemical vapor deposition (CVD), thermal chemical vapor deposition (TCVD), plasma enhanced chemical vapor deposition (PECVD), sputtering, or electron beam deposition (e-beam evaporation).

Referring to FIG. 4B, a stacked structure including a first material layer 120', a second material layer 130', and a third material layer 140', which may be sequentially stacked, may be formed or disposed on the buffer layer 110. The first material layer 120', the second material layer 130', and the third material layer 140' may be formed by, for example, vapor deposition methods such as CVD, TCVD, PECVD, sputtering, or e-beam evaporation.

Referring to FIG. 4C, a second photoresist pattern PR may be formed or disposed on the stacked structure including the first material layer 120', the second material layer 130', and the third material layer 140'. The second photoresist pattern PR may expose a portion of the third material layer 140' and may include a portion having a first thickness t1 and a portion having a second thickness t2 smaller than the first thickness t1. In this regard, a thickness refers to the shortest distance from a top surface of the third material layer 140' to a top surface of the second photoresist pattern PR.

The second photoresist pattern PR may be formed by using a second mask. The second mask may be a half-tone mask or a slit mask. A halftone mask or a slit mask may be divided into a transmissive region that transmits light, a transflective region that transmits some light, and an opaque region that blocks the transmission of light, depending on the transmittance of light. In a case that the photoresist is exposed through the second mask and developed, the photoresist regions corresponding to the transmissive region and the transflective region may be removed by different thicknesses, and the photoresist region corresponding to the opaque region may remain without being removed. Accordingly, these regions of the second photoresist pattern PR may have different thicknesses.

Regarding the second photoresist pattern PR, the portion having the first thickness t1 may correspond to the channel region (see C of FIG. 3) of the semiconductor layer (see Act of FIG. 3), the storage capacitor (see Cap of FIG. 3), the pad (see 400 of FIG. 3), and the second conductive layer (see 510 of FIG. 3) of the electrode connection part (see 500 of FIG. 3), and the portion having the second thickness t2 may correspond to the source region (see S of FIG. 3) and the drain region (see D of FIG. 3) of the semiconductor layer Act.

Referring to FIG. 4D, a portion of the third material layer 140' may be removed. In an embodiment, the portion of the third material layer 140' may be removed by wet etching using the second photoresist pattern PR as an etch mask. In this regard, the portion of the third material layer 140' to be removed may correspond to the portion of the second photoresist pattern PR exposing the third material layer 140'. In an embodiment, the portion of the third material layer 140' may be removed by dry etching.

Referring to FIG. 4E, a portion of the second material layer 130' may be removed. In an embodiment, the portion of the second material layer 130' may be removed by dry etching using the second photoresist pattern PR as an etch mask. In this regard, the portion of the second material layer 130' to be removed may correspond to a portion of the second material layer 130' exposed by the second photoresist pattern PR and the removed portion of the third material layer 140'. In an embodiment, in a case that the portion of the third material layer 140' may be removed by dry etching, the portion of the second material layer 130' may be removed by wet etching.

Referring to FIG. 4F, a portion of the second photoresist pattern PR may be removed by performing, for example, an etch back process thereon. For example, the second photoresist pattern PR may be removed by at least the second thickness t2 by using an ashing process using oxygen gas. Regarding the second photoresist pattern PR, the portion having the second thickness t2, which may be relatively small, may be completely removed, and the portion having the first thickness t1, which may be relatively great, may be incompletely removed and may remain to be a third thickness t3, and thus, a residual photoresist pattern PRr may be formed.

Referring to FIG. 4G, the first material layer 120' and the third material layer 140' may be etched, and the third material layer 140' may be etched to form the gate electrode GE. In an embodiment, the third material layer 140' may be removed by wet etching using the residual photoresist pattern PRr as an etch mask. In this regard, since the second material layer 130' of which a portion has been removed exposes a portion of the first material layer 120' lying thereunder, the portion of the first material layer 120' may also be removed. Since wet etching proceeds isotropically, the side of the first material layer 120' may also be etched, and thus, the first material layer 120' may occupy a smaller area than the second material layer 130' which may remain in a plan view. In an embodiment, in a case that the portion of the second material layer 130' is removed through wet etching, dry etching may be used to form a gate electrode layer 140.

Meanwhile, by etching the third material layer 140', the first capacitor plate Cap1 of the storage capacitor Cap, the second pad electrode 420 of the pad 400, and the second conductive layer 520 of the electrode connection part 500 may also be formed.

Referring to FIG. 4H, the second insulating layer 130' may be etched to form the gate insulating layer 130 and the semiconductor layer Act. In an embodiment, the second material layer 130' may be removed by dry etching by using the residual photoresist pattern PRr as an etch mask. In this regard, in a case that the portion of the second material layer 130' is etched, some or a predetermined number of regions of the first material layer 120' lying thereunder may be exposed to an etchant such as an etching gas. The portion exposed to the etchant may be the source region S or the drain region D of the semiconductor layer Act by implantation of impurities.

A portion of the second material layer 130' that may overlap the residual photoresist pattern PRr may not be etched, and may be the gate insulating layer 130. Since a portion of the first material layer 120' that may overlap the gate insulating layer 130 may not be exposed by the etchant, impurities may not be implanted thereinto and the channel region C of the semiconductor layer Act may be formed.

Portions of the first material layer 120' that may overlap the residual photoresist pattern PRr may be the dummy capacitor plate Cap-D of the storage capacitor Cap, the dummy pad electrode 430 of the pad 400, and a dummy conductive layer 540 of the electrode connection part 500.

Meanwhile, in an embodiment, in a case that dry etching is used to form the gate electrode layer 140, wet etching may be used to etch the second material layer 130'.

Referring to FIG. 4I, the residual photoresist pattern PRr may be removed. The semiconductor layer Act and the gate electrode GE of the thin-film transistor TFT may be formed.

Referring to FIG. 4J, a passivation material layer 150' covering or overlapping the semiconductor layer Act and the gate electrode layer 140 may be formed. In an embodiment, the passivation material layer 150' may be formed by, for example, vapor deposition methods such as CVD, TCVD, PECVD, sputtering, or e-beam evaporation.

Referring to FIG. 4K, the passivation layer 150 may be formed by forming first holes HL1 exposing at least a portion of the lower electrode pattern layer BPL and semiconductor layer Act in the passivation material layer 150'. The portion of the semiconductor layer Act exposed by the first holes HL1 may be the source region S or drain region D of the semiconductor layer Act. The portion of the lower electrode pattern layer BPL exposed by the first holes HL1 may be the source electrode SE, the drain electrode DE, and the third capacitor plate Cap3. The first holes HL1 may also expose the second pad electrode 420 and the second conductive layer 520. The first holes HL1 exposing the lower electrode pattern layer BPL may constitute a portion of the buffer layer 110. For the forming of the first holes HL1, a 3-1 mask having a pattern corresponding to the first holes HL1 may be used, for example, a photolithography process may be used.

Referring to FIG. 4L, the bridge electrode BE corresponding to first holes HL1 may be formed or disposed on the passivation layer 150. The bridge electrode BE may be an electrode pattern layer formed in a pattern corresponding to the first holes HL1. In forming the bridge electrode BE, a 4-1 mask may be used, and, for example, a photolithography process may be used.

The bridge electrode BE may include the first bridge electrode BE1 electrically connecting the source electrode SE with the source region S of the semiconductor layer Act and the second bridge electrode BE2 electrically connecting the drain electrode DE and the drain region D of the semiconductor layer Act. A portion of the bridge electrode BE may overlap the first capacitor plate Cap1 of the storage capacitor Cap to form the second capacitor plate Cap2. Another portion of the bridge electrode BE may form the first pad electrode 410, which may be electrically connected to the second pad electrode 420 of the pad 400. Another part of the bridge electrode BE may form the connection electrode 530 which may be electrically connected to the first conductive layer 510 and second conductive layer 520 of the electrode connection part 500.

Referring to FIG. 4M, the planarization insulating layer 170 may be formed or disposed on the passivation layer 150, and the planarization insulating layer 170 may cover or overlap the bridge electrode BE. The planarization insulating layer 170 may include openings 170OP exposing at least a portion of the bridge electrode BE. In forming the planarization insulating layer 170, a fifth mask having a pattern corresponding to the openings 170OP may be used and, for example, a photolithography process may be used.

For example, from among the openings 170OP of the planarization insulating layer 170, the first opening 170OP1 may expose a portion of the first bridge electrode BE1 electrically connecting the first source electrode SE1 of the first thin-film transistor T1 with a first source region S1 of the first semiconductor layer Act1. In an embodiment, the first opening 170OP1 may expose a portion of the second bridge electrode BE2 electrically connecting a first drain electrode DE1 of the first thin-film transistor T1 with a first drain region D1 of the first semiconductor layer Act1. The first opening 170OP1 may be a contact hole electrically connecting between the pixel electrode 210 and the bridge electrode BE, which will be described later.

From among the openings 170OP of the planarization insulating layer 170, the second opening 170OP2 may expose the second pad electrode 420 of the pad 400. As described above with reference to FIG. 3, the second opening 170OP2 may not be covered or overlapped but may be exposed by the planarization insulating layer 170 to allow the pad 400 to be electrically connected to the flexible printed circuit board.

Referring to FIG. 4N, the pixel electrode 210 may be formed or disposed on the planarization insulating layer 170. In forming the pixel electrode 210, a sixth mask having a pattern corresponding to the pixel electrode 210 may be used and, for example, a photolithography process may be used.

The pixel electrode 210 may be electrically connected to the bridge electrode BE through a contact hole formed in the planarization insulating layer 170, that is, the first opening 170OP1. The bridge electrode BE electrically connected to the pixel electrode 210 may be either the first bridge electrode BE1 or the second bridge electrode BE2 of the first thin-film transistor T1.

Referring to FIG. 4O, the pixel definition layer 190 covering or overlapping at least a portion of the pixel electrode 210 may be formed or disposed on the pixel electrode 210. The pixel definition layer 190 may cover or overlap an edge of the pixel electrode 210 and may have the opening 190OP exposing the center portion of the pixel electrode 210. In forming the pixel definition layer 190, the seventh mask having a pattern corresponding to the pixel definition layer 190 may be used and, for example, a photolithography process may be used.

Thereafter, by using the photolithography process using the seventh mask, the interlayer (see 220 of FIG. 3) corresponding to the pixel electrode 210 may be formed or disposed on the pixel definition layer 190. Then, the counter electrode (see 230 of FIG. 3) and the thin film encapsulation layer (see 300 of FIG. 3) may be formed or disposed on the interlayer (see 220 of FIG. 3), and, for example, CVD, TCVD, PECVD, sputtering, e-beam evaporation, or other vapor deposition methods may be used.

As a comparative example, 10 masks may be used to manufacture a display apparatus in which the source electrode SE and the drain electrode DE may be placed or disposed on the gate electrode GE, an interlayer insulating layer may be placed or disposed between the gate electrode GE and the source electrode SE or drain electrode DE, the source electrode SE may be electrically connected to the lower electrode pattern layer BPL placed or disposed under or below the semiconductor layer Act through a contact hole formed in the interlayer insulating layer, and the first pad electrode 410 may be formed or disposed above the source electrode SE and the drain electrode DE.

However, according to an embodiment of the disclosure, the lower electrode pattern layer BPL and the source electrode SE and drain electrode DE may be formed using one mask, the semiconductor layer Act and gate electrode GE may be formed using one mask, and the first pad electrode 410 and the bridge electrode BE may be formed by using one mask. Accordingly, a total of seven masks may be used to manufacture the display apparatus 1. Through this, the manufacturing cost of the display apparatus 1 may be reduced and productivity thereof may be improved.

Figure 5:
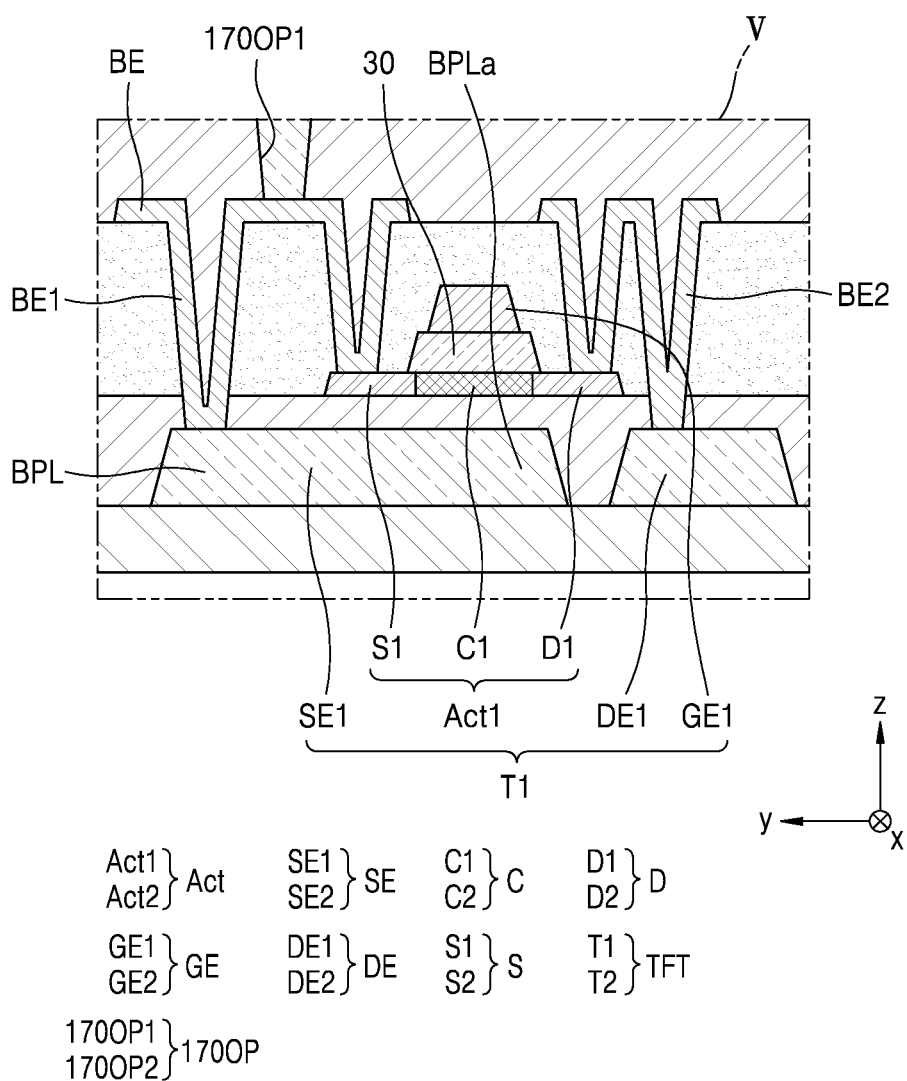
FIG. 5 is an enlarged schematic cross-sectional view schematically illustrating a portion of a display apparatus according to an embodiment.

FIG. 5 is an enlarged schematic cross-sectional view schematically illustrating a portion of a display apparatus according to an embodiment. FIG. 5 illustrates the first thin-film transistor T1, and may correspond to the portion V of FIG. 3.

Referring to FIG. 5, the portion BPLa of the lower electrode pattern layer BPL and the first source electrode SE1 may be formed as one body. However, the first drain electrode DE1 may not be formed as one body with the portion BPLa and the first source electrode SE1, and may be formed in an island or an isolated shape in a plan view thereof. The positions of the first source electrode and the first drain electrode may be interchanged.

The portion BPLa of the lower electrode pattern layer BPL may receive a constant voltage, for example, a first power voltage (see ELVDD of FIG. 2), applied by the first source electrode SE1, and may prevent the first thin-film transistor T1 from being affected by surrounding electrodes, thereby resulting in an electrical stability. Accordingly, the driving thin-film transistor, which may be the first thin-film transistor T1, may have a stabilized output characteristic, and the light-emitting element of the display apparatus 1 may emit light with a constant luminance. Thus, the display performance and the display quality may be improved.

Figure 6:
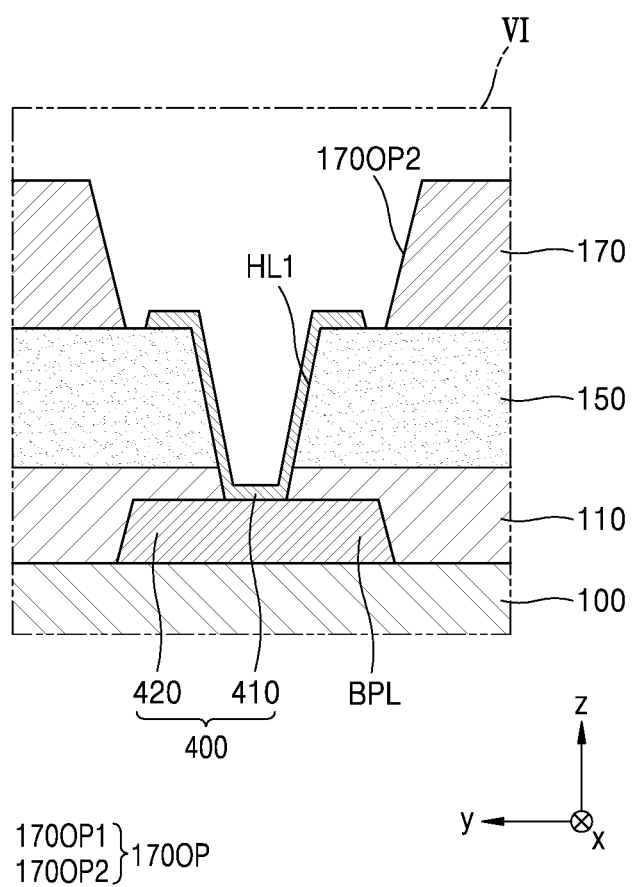
FIG. 6 is an enlarged schematic cross-sectional view schematically illustrating a portion of a display apparatus according to an embodiment.

FIG. 6 is an enlarged schematic cross-sectional view schematically illustrating a portion of a display apparatus according to an embodiment. FIG. 6 shows the pad 400, and FIG. 6 may correspond to portion VI of FIG. 3.

Referring to FIG. 6, the pad 400 may include the first pad electrode 410 including the same or similar material as the bridge electrode BE and the second pad electrode 420 including the same or similar material as the lower electrode pattern layer BPL. In this case, the first pad electrode 410 may be electrically connected to the second pad electrode 420 through one of the first holes HL1 formed in the passivation layer 150 and the buffer layer 110.

To form the pad 400, in a case that the lower electrode pattern layer BPL of FIG. 4A is formed, the pattern of the first mask may be changed such that the lower electrode pattern layer BPL may include the second pad electrode 420.

Then, in a case that the second photoresist pattern PR may be formed or disposed on the third material layer 140', which has been described in connection with FIG. 4C, the pattern of the second mask may be changed such that the second photoresist pattern (see PR of FIG. 4C) may expose the region where the first pad electrode 410 may be placed. By using the changed second mask, the third material layer 140' the second material layer 130', and the first material layer 120' placed or disposed in the region where the first pad electrode 410 may be placed, may be removed.

Then, in a case that the first holes HL1 are formed in the passivation layer 150, which has been described in connection with FIG. 4K, the pattern of the 3-1 mask may be changed such that the first holes HL1 may expose the second pad electrode 420 of the lower electrode pattern layer BPL.

Finally, in a case that the bridge electrode BE corresponding to the first holes HL1 is formed, which has been described in connection with FIG. 4L, the pattern of the 4-1 mask may be changed such that the bridge electrode BE may also be formed in the first hole HL1 exposing the first pad electrode 410. As such, the second pad electrode 420 electrically connected to the first pad electrode 410 may be formed.

Through the above-described process, the pad 400 shown in FIG. 6 may be formed without increasing the number of masks. In this case, the electrode connection part 500 may not be required for the first pad electrode 410 to be electrically connected to the source electrode SE or drain electrode DE of the thin-film transistor TFT. Accordingly, the electrode connection part 500 may less occupy the surrounding area SA, and thus, the available space for the formation of the pad 400 may be increased or the surrounding area SA, which may be a non-display area of the display apparatus 1, may be reduced.

Figure 7:
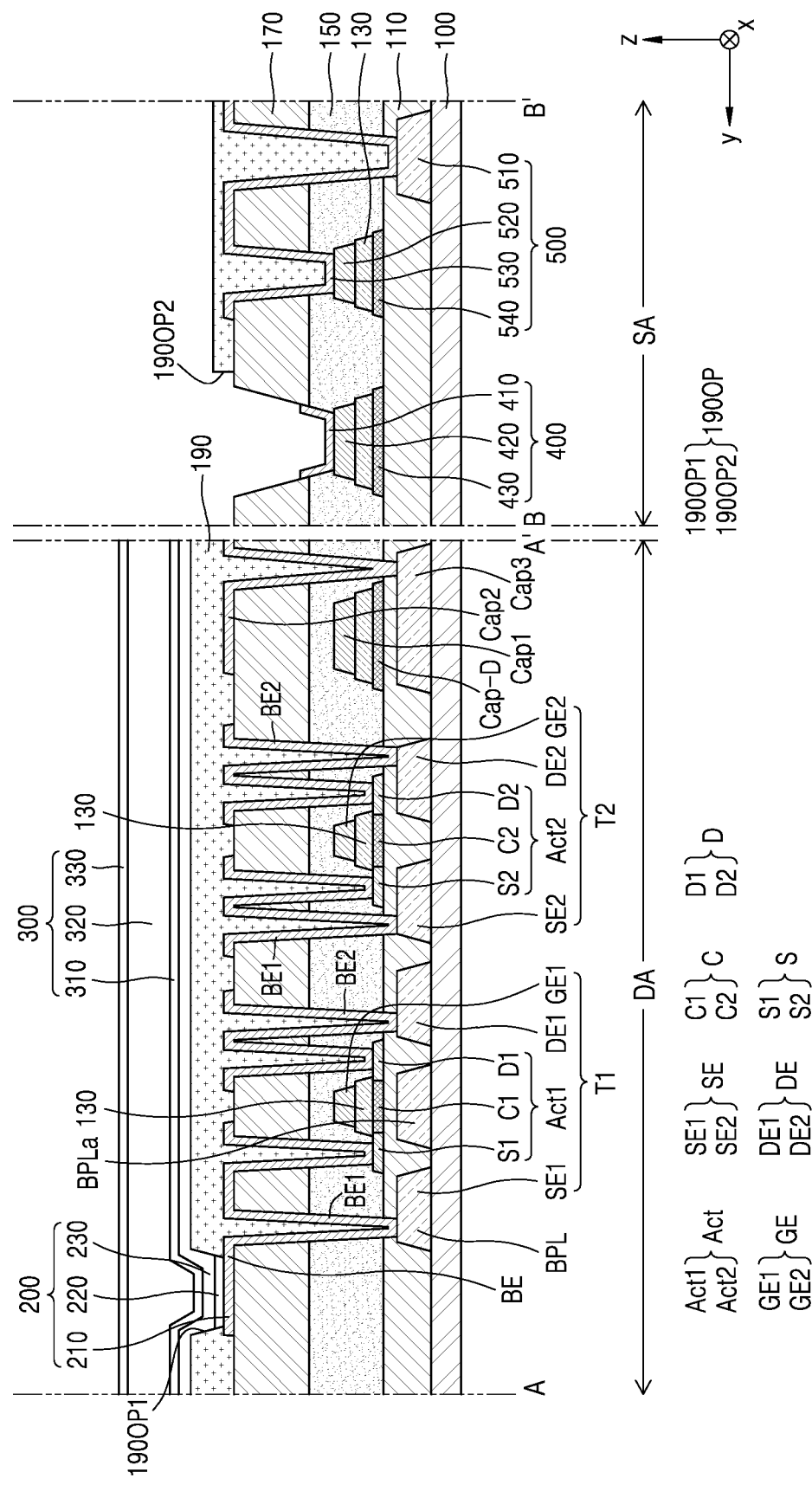
FIG. 7 is a schematic cross-sectional view schematically illustrating a portion of a display apparatus according to an embodiment.

FIG. 7 is a schematic cross-sectional view schematically illustrating a portion or region of a display apparatus according to an embodiment. Description of the same or similar features of the display apparatus described with reference to FIG. 3 will be omitted, and embodiments will be provided based on the differences between the display apparatuses of FIGS. 3 and 7.

The planarization insulating layer 170 may be placed or disposed on the passivation layer 150 covering or overlapping the semiconductor layer Act and the gate electrode GE, and the bridge electrode BE may be placed or disposed on the planarization insulating layer 170. The bridge electrode BE may electrically connect the semiconductor layer Act with the lower electrode pattern layer BPL through contact holes formed in the passivation layer 150 and the planarization insulating layer 170.

In an embodiment, the bridge electrode BE may include the first bridge electrode BE1 electrically connecting the source electrode SE with the source region S of the semiconductor layer Act and the second bridge electrode BE2 electrically connecting the drain electrode DE and the drain region D of the semiconductor layer Act. In an embodiment, the first bridge electrode BE1 may be electrically connected to the source region S through contact holes formed in the passivation layer 150 and planarization insulating layer 170, and to the source electrode SE through contact holes formed in the passivation layer 150, the planarization insulating layer 170, and the buffer layer 110. Similarly, the second bridge electrode BE2 may be electrically connected to the drain region D through contact holes formed in the passivation layer 150 and the planarization insulating layer 170, and to the drain electrode DE through contact holes formed in the passivation layer 150, the planarization insulating layer 170, and the buffer layer 110. In an embodiment, the positions of the first bridge electrode BE1 and the second bridge electrode BE2 may be interchanged.

The first bridge electrode BE1 or the second bridge electrode BE2 may include the pixel electrode 210. In an embodiment, a portion of the first bridge electrode BE1 may extend on the planarization insulating layer 170 to form the pixel electrode 210, and, in this case, the first bridge electrode BE1 and the pixel electrode 210 may be formed as one body, and the first bridge electrode BE1 may include a reflective film including magnesium (Mg), aluminum (Al), platinum (Pt), palladium (Pd), gold (Au), nickel (Ni), neodymium (Nd), iridium (Ir), chromium (Cr), or compounds thereof. The first bridge electrode BE1 may include a transparent conductive film placed or disposed above or/and below the reflective film.

The pixel definition layer 190 may be placed or disposed on the bridge electrode BE. The pixel definition layer 190 may cover or overlap the bridge electrode BE as a whole, and may have a first opening 190OP1 exposing the central portion of the pixel electrode 210 placed in the display area DA and a second opening 190OP2 exposing the pad 400 placed or disposed in the surrounding area SA. A light-emitting region of a light-emitting element, that is, the pixel may be defined by the first opening 190OP1 of the pixel definition layer 190, and the pad 400 may be electrically connected to the printed circuit board through the second opening 190OP2 of the pixel definition layer 190.

In the display area DA, the interlayer 220, the opposite electrode 230, and the thin-film encapsulation layer 300 may be sequentially formed or disposed on the pixel definition layer 190.

FIGS. 8A to 8E are schematic cross-sectional views of the display apparatus of FIG. 7 schematically illustrating processes of the manufacturing method thereof.

Figure 8A:
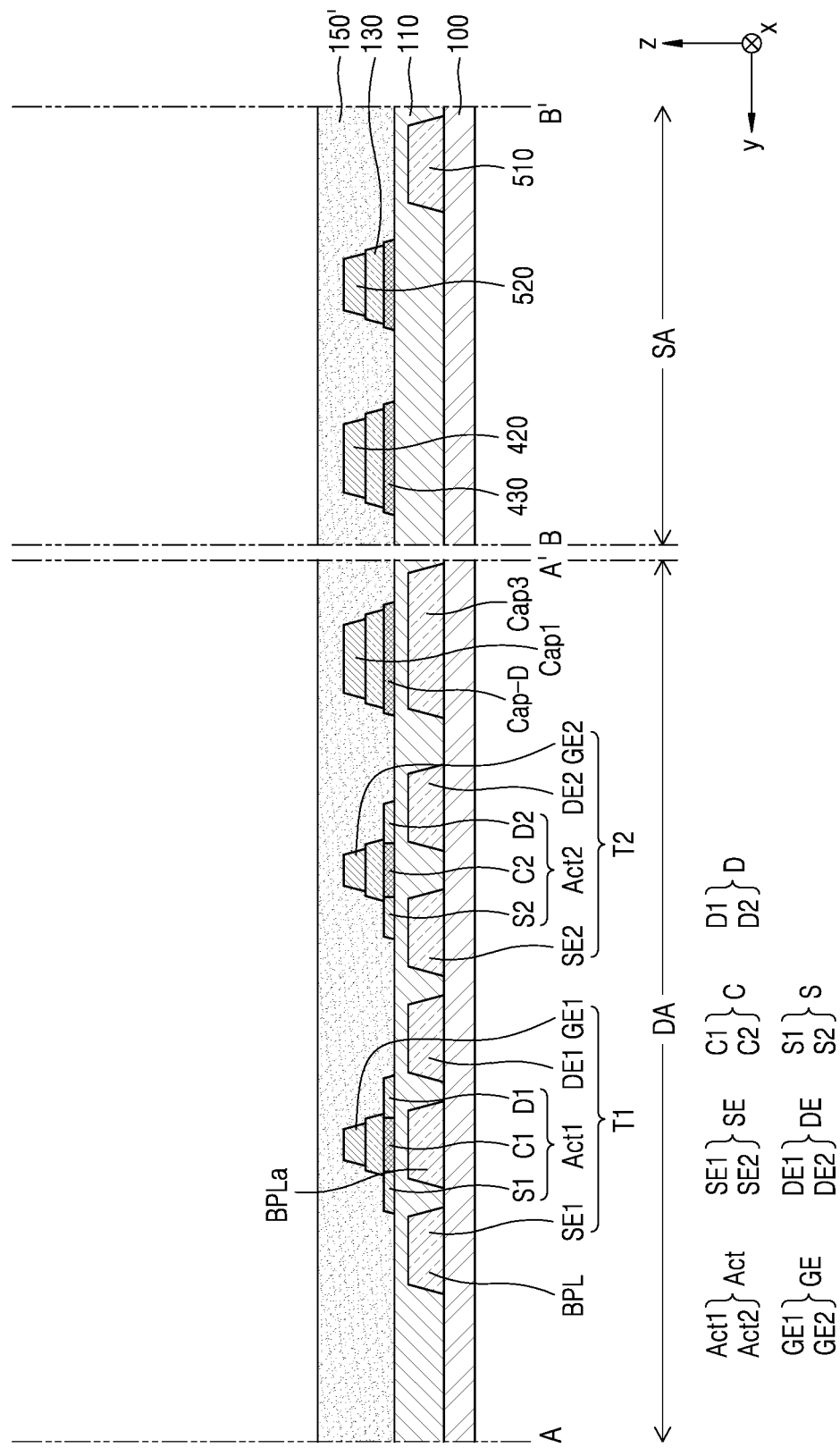
FIGS. 8A to 8E are schematic cross-sectional views schematically illustrating processes of a method of manufacturing the display apparatus of FIG. 7.

The previous processes of the processes illustrated in FIG. 8A may be the same as the processes of the manufacturing method of the display apparatus 1 described in connection with FIGS. 4A to 4I, and may be performed using a first mask and a second mask. The schematic cross-sectional view of FIG. 8A may be the same as that of the display apparatus 1 described in connection with FIG. 4J.

Figure 8B:
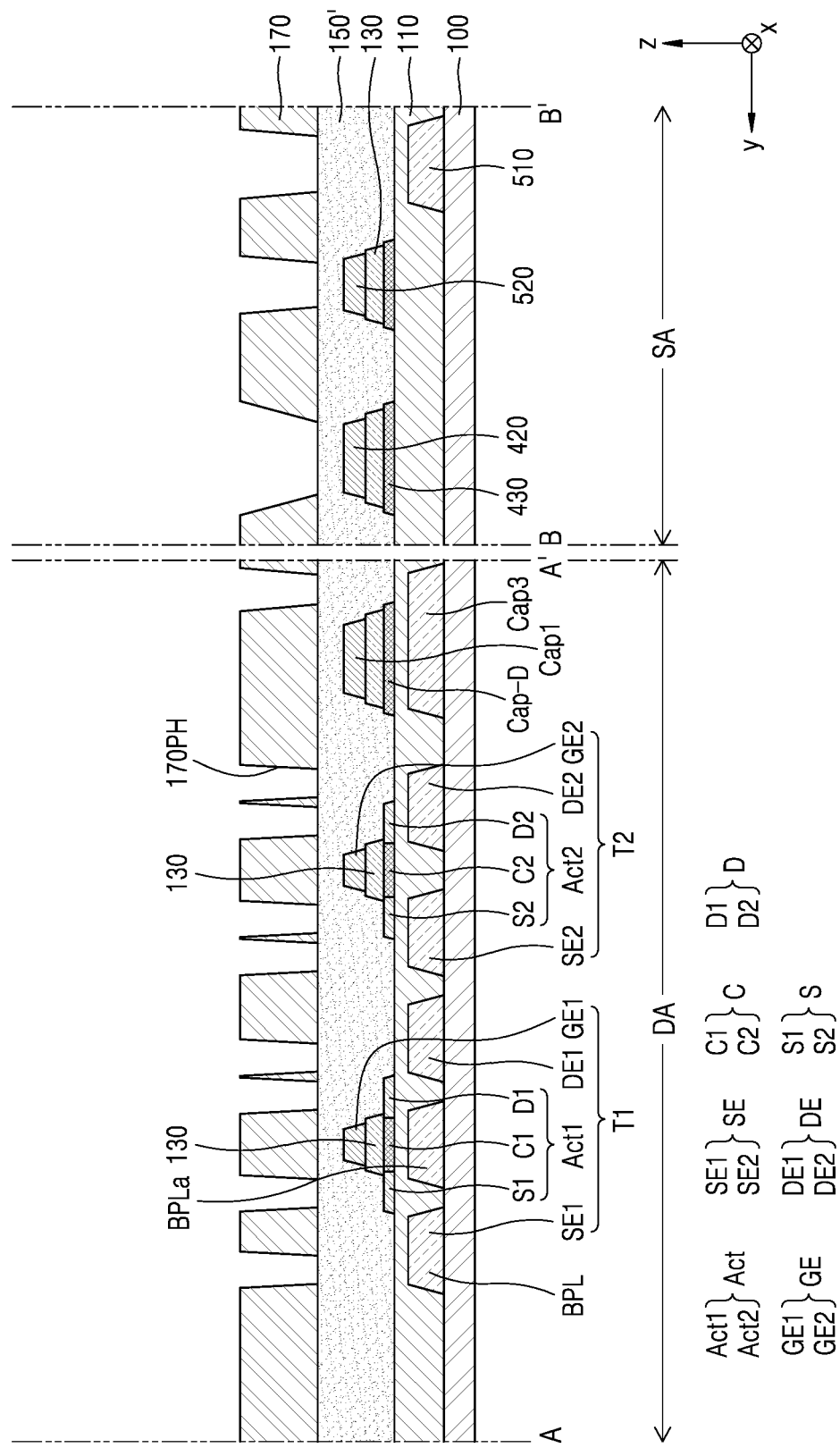

Referring to FIG. 8B, the planarization insulating layer 170 including pattern holes 170PH may be formed on the passivation material layer 150'. The pattern holes 170PH may correspond to at least a portion of the lower electrode pattern layer BPL and semiconductor layer Act. For the formation of the planarization insulating layer 170, a 3-2 mask including a pattern corresponding to the pattern holes 170PH may be used, and, for example, a photolithography process may be performed.

The portion of the semiconductor layer Act corresponding to the pattern holes 170PH may be the source region S or drain region D of the semiconductor layer Act. A portion of the lower electrode pattern layer BPL corresponding to pattern holes 170PH may be the source electrode SE, the drain electrode DE, the third capacitor plate Cap3, and the first conductive layer 510. In an embodiment, the pattern holes 170PH may correspond to the second pad electrode 420 of the pad 400 and the second conductive layer 520 of the electrode connection part 500.

Figure 8C:
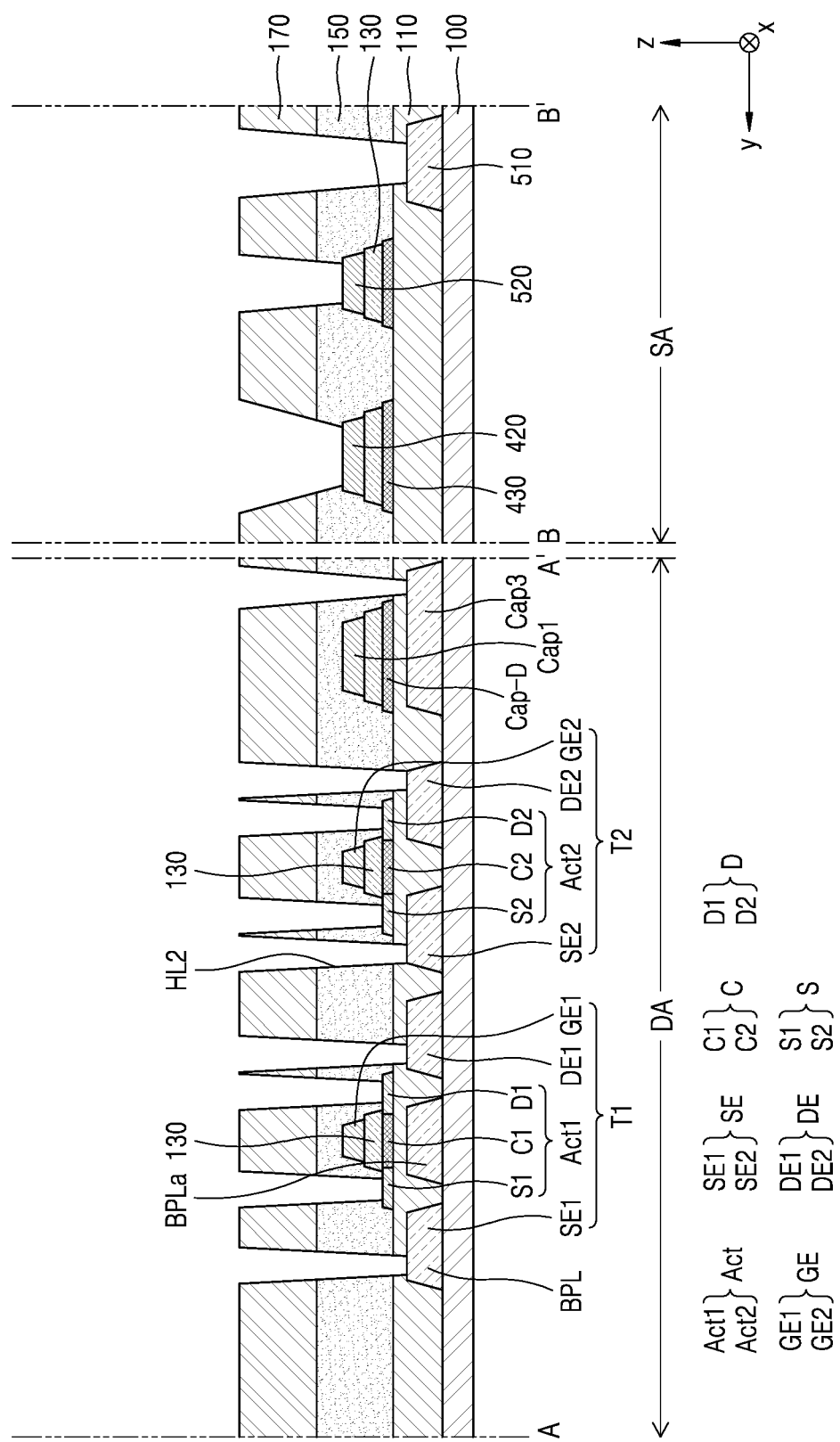

Referring to FIG. 8C, the passivation layer 150 may be formed by forming second holes HL2 corresponding to the pattern holes 170PH in the passivation material layer 150' by using the planarization insulating layer 170 having the pattern holes 170PH.

In an embodiment, the passivation layer 150 having the second holes HL2 corresponding to the pattern holes 170PH may be formed by etching the passivation material layer 150' by using the planarization insulating layer 170 having the pattern holes 170PH as an etch mask. The second hole HL2 may include a hole formed in the passivation layer 150 and a pattern hole formed in the planarization insulating layer 170. Some or a predetermined number of the second holes HL2 may be formed in the buffer layer 110.

Since the second holes HL2 correspond to the pattern holes 170PH, the second holes HL2 may expose the source region S and drain region D of the semiconductor layer Act, the source electrode SE, the drain electrode DE, the third capacitor plate Cap3, the second pad electrode 420, the first conductive layer 510, and the second conductive layer 520, respectively. As described above, the number of masks for making holes (or openings) formed in the passivation layer 150 and the planarization insulating layer 170 to expose the semiconductor layer Act, the lower electrode pattern layer BPL, or the like, may be reduced to one. For example, the passivation layer 150 and the planarization insulating layer 170 having the second holes HL2 may be formed using a 3-2 mask.

Figure 8D:
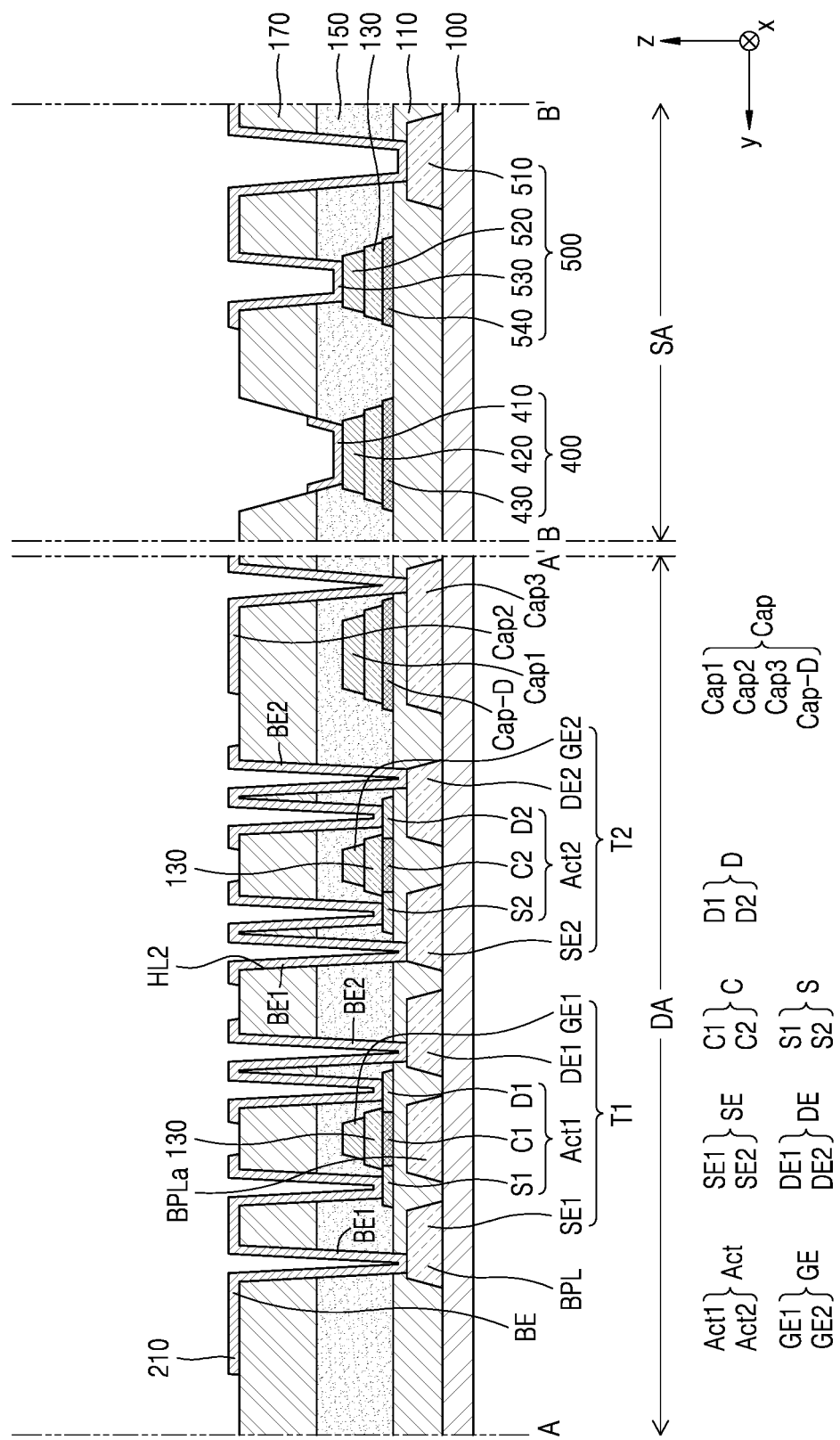

Referring to FIG. 8D, the bridge electrode BE corresponding to the second holes HL2 may be formed on the planarization insulating layer 170. The bridge electrode BE may be an electrode pattern layer formed in a pattern corresponding to the second holes HL2. In forming the bridge electrode BE, a 4-2 mask may be used, and, for example, a photolithography process may be used.

Regarding the bridge electrode BE, the first bridge electrode BE1 may electrically connect the source electrode SE with the source region S of the semiconductor layer Act, and the second bridge electrode BE2 may electrically connect the drain electrode DE with the drain region D of the semiconductor layer Act.

In an embodiment, the first bridge electrode BE1 electrically connecting the source electrode SE with the source region S may extend on the planarization insulating layer 170 so that the extended portion may constitute the pixel electrode 210. In an embodiment, the second bridge electrode BE2 may extend on the planarization insulating layer 170 to form the pixel electrode 210.

As such, the bridge electrode BE and the pixel electrode 210 may be formed as one body, and the number of masks required to form the bridge electrode BE and pixel electrode 210 may be reduced to one.

Figure 8E:
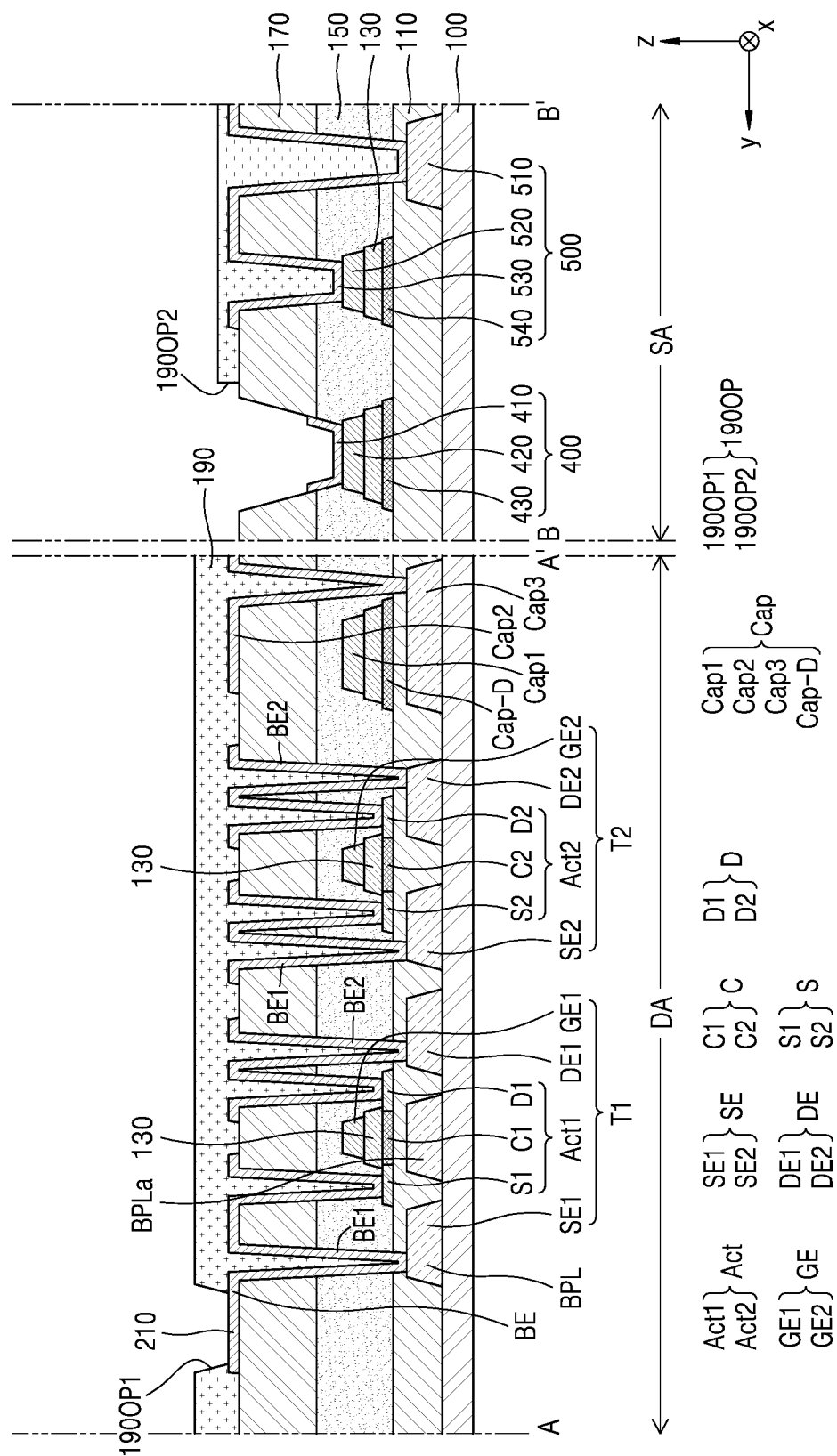

Referring to FIG. 8E, the pixel definition layer 190 may be formed or disposed on the bridge electrode BE. The pixel definition layer 190 may cover or overlap the bridge electrode BE as a whole, and may have the first opening 190OP1 exposing the central portion of the pixel electrode 210 and the second opening 190OP2 exposing the first pad electrode 410 of the pad 400. In forming the pixel definition layer 190, a 5-2 mask having a pattern corresponding to the pixel definition layer 190 may be used and, for example, a photolithography process may be used.

Through the above-described method, the number of masks required to form up to the pixel definition layer 190 of display apparatus 1 may be reduced to five. Accordingly, the manufacturing cost of the display apparatus 1 may be reduced and productivity thereof may be improved.

Embodiments as described above may provide a display apparatus and a method of manufacturing the same, in which the number of masks and the number of photolithography processes applied to the manufacturing process may be decreased, and thus, the manufacturing costs may be reduced and productivity may be increased, power consumption may be reduced, and display performance is good. However, the scope of the disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a switching thin-film transistor located in a display area and including a semiconductor layer and a gate electrode;
a storage capacitor located in the display area and including a dummy capacitor plate, a first capacitor plate on and spaced apart from the dummy capacitor plate and electrically connected to the semiconductor layer, and a second capacitor plate on and spaced apart from the dummy capacitor plate, the dummy capacitor plate, the first capacitor plate, and the second capacitor plate overlapping each other, the second capacitor plate electrically connected to a driving voltage line;
a light-emitting diode electrically connected to the switching thin-film transistor and the storage capacitor and including a pixel electrode, an interlayer, and a counter electrode;
a pad located in a surrounding area adjacent to the display area;
a lower electrode pattern layer disposed below the semiconductor layer, at least a portion of the lower electrode pattern layer overlapping the semiconductor layer; and
a bridge electrode electrically connecting the semiconductor layer to the lower electrode pattern layer,
wherein
the dummy capacitor plate and the semiconductor layer comprise a same material.

2. The display apparatus of claim 1, wherein the first capacitor plate and the gate electrode comprise a same material.

3. The display apparatus of claim 1, wherein:
the storage capacitor includes a third capacitor plate disposed below the first capacitor plate and the dummy capacitor plate, the third capacitor plate being electrically connected to the second capacitor plate, and
the third capacitor plate overlaps the dummy capacitor plate, the first capacitor plate, and the second capacitor plate.

4. The display apparatus of claim 1, wherein
the pad comprises a first pad electrode and a second pad electrode electrically connected to the first pad electrode, and
the first pad electrode and the bridge electrode comprise a same material.

5. The display apparatus of claim 4, wherein the second pad electrode and the gate electrode or the lower electrode pattern layer comprise a same material.

6. The display apparatus of claim 1, further comprising:
a driving thin-film transistor located in the display area and including a second gate electrode, the second gate electrode being electrically connected to the first capacitor plate and the semiconductor layer.

7. A display apparatus comprising:
a thin-film transistor located in a display area and including a semiconductor layer and a gate electrode;
a storage capacitor located in the display area and including a first capacitor plate, a second capacitor plate, and a dummy capacitor plate overlapping each other;
a light-emitting diode electrically connected to the thin-film transistor and the storage capacitor and including a pixel electrode, an interlayer, and a counter electrode;
a pad located in a surrounding area adjacent to the display area;
a lower electrode pattern layer disposed below the semiconductor layer, at least a portion of the lower electrode pattern layer overlapping the semiconductor layer; and
a bridge electrode electrically connecting the semiconductor layer to the lower electrode pattern layer,
wherein
the semiconductor layer comprises:
a channel region overlapping the gate electrode; and
a source region and a drain region respectively disposed on opposite sides of the channel region, and
the lower electrode pattern layer comprises:
a source electrode electrically connected to the source region of the semiconductor layer; and
a drain electrode electrically connected to the drain region of the semiconductor layer.

8. The display apparatus of claim 7, further comprising:
a passivation layer overlapping the gate electrode,
wherein the bridge electrode is disposed on the passivation layer, and comprises:
a first bridge electrode electrically connecting the source electrode of the lower electrode pattern to the source region of the semiconductor layer; and
a second bridge electrode electrically connecting the drain electrode of the lower electrode pattern to the drain region of the semiconductor layer.

9. The display apparatus of claim 8, further comprising:
a planarization insulating layer disposed on the bridge electrode,
wherein the pixel electrode is electrically connected to either the first bridge electrode or the second bridge electrode through a contact hole formed in the planarization insulating layer.

10. The display apparatus of claim 8, wherein the first bridge electrode or the second bridge electrode comprises the pixel electrode.

* * * * *